US008686434B2

(12) United States Patent
Harada et al.

(10) Patent No.: US 8,686,434 B2
(45) Date of Patent: Apr. 1, 2014

(54) SILICON CARBIDE SEMICONDUCTOR DEVICE AND METHOD FOR MANUFACTURING THE SAME

(75) Inventors: Shin Harada, Osaka (JP); Takeyoshi Masuda, Osaka (JP); Keiji Wada, Osaka (JP); Masato Tsumori, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 85 days.

(21) Appl. No.: 13/063,083

(22) PCT Filed: Feb. 3, 2009

(86) PCT No.: PCT/JP2009/051762
§ 371 (c)(1),
(2), (4) Date: Mar. 9, 2011

(87) PCT Pub. No.: WO2010/058610
PCT Pub. Date: May 27, 2010

(65) Prior Publication Data
US 2011/0186862 A1 Aug. 4, 2011

(30) Foreign Application Priority Data
Nov. 20, 2008 (JP) ................................ 2008-297088

(51) Int. Cl.
*H01L 29/06* (2006.01)
(52) U.S. Cl.
USPC ...... 257/77; 257/627; 257/628; 257/E29.084; 257/E29.104
(58) Field of Classification Search
USPC ............ 257/77, 627, 628, E29.084, E29.104; 438/105, 931
See application file for complete search history.

(56) References Cited

U.S. PATENT DOCUMENTS

| 6,482,704 B1 | 11/2002 | Amano et al. |
| 7,256,082 B2 | 8/2007 | Kosugi et al. |

(Continued)

FOREIGN PATENT DOCUMENTS

| CN | 1802752 A | 7/2006 |
| CN | 1925169 A | 3/2007 |

(Continued)

OTHER PUBLICATIONS

Fukuda et al., "Effect of high-temperature hydrogen annealing on interface properties, channel mobility and hot carrier tolerance of SiC MOS structures," FED Journal, vol. 11, No. 2, pp. 77-80 (2000).

(Continued)

*Primary Examiner* — Andy Huynh
(74) *Attorney, Agent, or Firm* — Venable LLP; Michael A. Sartori; Tamatane J. Aga

(57) ABSTRACT

There is provided a silicon carbide semiconductor device having excellent electrical characteristics such as channel mobility, and a method for manufacturing the same. A semiconductor device includes a substrate made of silicon carbide and having an off-angle of greater than or equal to 50° and less than or equal to 65° with respect to a surface orientation of {0001}, a p-type layer serving as a semiconductor layer, and an oxide film serving as an insulating film. The p-type layer is formed on the substrate and is made of silicon carbide. The oxide film is formed to contact with a surface of the p-type layer. A maximum value of the concentration of nitrogen atoms in a region within 10 nm of an interface between the semiconductor layer and the insulating film (interface between a channel region and the oxide film) is greater than or equal to $1 \times 10^{21}$ cm$^{-3}$.

14 Claims, 13 Drawing Sheets

(56) References Cited

U.S. PATENT DOCUMENTS

| | | |
|---|---|---|
| 2002/0038891 A1 | 4/2002 | Ryu et al. |
| 2002/0072247 A1 | 6/2002 | Lipkin et al. |
| 2002/0102358 A1 | 8/2002 | Das et al. |
| 2004/0242022 A1 | 12/2004 | Kosugi et al. |
| 2006/0220026 A1 | 10/2006 | Uchida et al. |
| 2007/0045631 A1 | 3/2007 | Endo et al. |
| 2008/0203441 A1 | 8/2008 | Endo |

FOREIGN PATENT DOCUMENTS

| | | |
|---|---|---|
| EP | 1 215 730 A1 | 6/2002 |
| EP | 1 981 076 A1 | 10/2008 |
| JP | 2001-210637 A | 8/2001 |
| JP | 2002-261275 A | 9/2002 |
| JP | 2003-086792 A | 3/2003 |
| JP | 2004-532522 T | 10/2004 |
| JP | 2005-019951 A | 1/2005 |
| JP | 2006-210818 A | 8/2006 |
| JP | 2008-244456 A | 10/2008 |
| KR | 10-2004-0002908 | 1/2004 |
| TW | 550670 B | 9/2003 |
| TW | 561624 B | 11/2003 |
| WO | WO-01/18872 A1 | 3/2001 |
| WO | WO-02/084727 A2 | 10/2002 |

OTHER PUBLICATIONS

Chakraborty et al., "Interface properties of $N_2O$-annealed SiC metal oxide semiconductor devices," Solid-State Electronics, vol. 45, Issue 3, pp. 471-474 (Mar. 2001).

Office Action in Chinese Patent Application No. 200980146557.3 dated Dec. 26, 2012.

Kimoto et al., "MOS Interface Properties and MOSFET Performance on 4H-SiC {0001} and Non-Basal Faces Processed by $N_2O$ Oxidation," Mat. Res. Soc. Symp. Proc. vol. 815, pp. 1-6 (2004).

Fukada et al., "Reduction of Interface-State Density in 4H-SiC $n$-Type Metal-Oxide-Semiconductor Structures Using High-Temperature Hydrogen Annealing," Applied Physics Letters, vol. 76, No. 12, pp. 1585-1587 (2000).

Noborio et al., "$N_2$0-Grown Oxides/4$H$-SiC (0001), (03-38), and (11-20) Interface Properties Characterized by Using p-Type Gate-Controlled Diodes," Applied Physics Letters, vol. 93 (pp. 139510-1-139510-3 (2008).

Chung et al., "Improved Inversion Channel Mobility for 4H-SiC MOSFETs Following High Temperature Anneals in Nitric Oxide," IEEE Electron Device Letters, vol. 22, No. 4, pp. 176-178.

Harada et al., "Improved Channel Mobility in Normally-Off 4H-SiC MOSFETs with Buried Channel Structure," Materials Science Forum vols. 389-393, pp. 1069-1072 (2002).

Extended European Search Report in European Patent Application No. 09827391.5 dated Apr. 5, 2013.

Fukuda et al., "Reduction of Interface-State Density in 4H-SiC $n$-Type Metal-Oxide-Semiconductor Structures Using High-Temperature Hydrogen Annealing," Applied Physics Letters, vol. 76, No. 12, pp. 1585-1587 (2000).

Noborio et al., "$N_2$0-Grown Oxides/4$H$-SiC (0001), (03-38), and (11-20) Interface Properties Characterized by Using p-Type Gate-Controlled Diodes," Applied Physics Letters, vol. 93 (pp. 193510-1-193510-3 (2008).

Office Action in Taiwanese Patent Application No. 098103745, dated Nov. 13, 2013.

Hiroyuki Matsunami, "Technological Breakthroughs in Growth Control of Silicon Carbide for High Power Electronic Devices," Japanese Journal of Applied Physics, vol. 43, No. 10, 2004, pp. 6835-6847.

Office Action in European Patent Application No. 09 827 391.5, dated Dec. 10, 2013.

SILICON CARBIDE SEMICONDUCTOR DEVICE AND METHOD FOR MANUFACTURING THE SAME

TECHNICAL FIELD

The present invention relates to a silicon carbide semiconductor device and a method for manufacturing the same, and more particularly, to a silicon carbide semiconductor device exhibiting excellent electrical characteristics, and a method for manufacturing the same.

BACKGROUND ART

Conventionally, a semiconductor device using silicon carbide (SiC) has been known (for example, International Publication No. WO01/018872 pamphlet (that will be referred to as Patent Document 1 hereinafter)). In Patent Document 1, a SiC substrate having a surface orientation of substantially {03-38} and having a 4H polytype is used to form an MOS-type field effect transistor (MOSFET) serving as a semiconductor device. In the MOSFET, a gate oxide film is formed by dry oxidation. According to above Patent Document 1, high channel mobility (about 100 cm$^2$/Vs) can be achieved in such MOSFET.

Patent Document 1: International Publication No. WO01/018872 pamphlet

DISCLOSURE OF THE INVENTION

Problems to be Solved by the Invention

As a result of the inventors' study, however, it has been found that the channel mobility may not be sufficiently increased in some cases in the aforementioned MOSFET. In order to cause the semiconductor device using SiC to stably exhibit the excellent characteristics, it is required to achieve high channel mobility in a reproducible manner.

The present invention has been made to solve the problems as described above, and an object of the present invention is to provide a silicon carbide semiconductor device having excellent electrical characteristics such as channel mobility, and a method for manufacturing the same.

Means for Solving the Problems

The inventor has earnestly researched a cause of decrease in the channel mobility in order to achieve high channel mobility in a reproducible manner in the semiconductor device using SiC as described above, and as a result, has completed the present invention. In other words, in the above semiconductor device, the gate oxide film is formed by the dry oxidation, and therefore, it is considered that such dry oxidation leads to the formation of many traps (interface state) at an interface between the gate oxide film and a SiC semiconductor film located under the gate oxide film. The presence of such interface state may become a factor of the decrease in the channel mobility described above. This is also presumed from the fact that a threshold voltage of the above MOSFET is significantly high as compared with a theoretical value. Hence, the inventor has searched for a method for reducing such influence of the interface state, and as a result, has found that the channel mobility can be increased by increasing the concentration of nitrogen atoms or the concentration of hydrogen atoms in the vicinity of the above interface. It is conceivable that this is because the influence of the interface state can be suppressed by increasing the concentration of the nitrogen atoms or the concentration of the hydrogen atoms in the vicinity of the interface. Based on such finding, a silicon carbide semiconductor device according to the present invention includes a substrate made of silicon carbide and having an off-angle of greater than or equal to 50° and less than or equal to 65° with respect to a surface orientation of {0001}, a semiconductor layer and an insulating film. The semiconductor layer is formed on the substrate and is made of silicon carbide. The insulating film is formed to contact with a surface of the semiconductor layer. A maximum value of a concentration of nitrogen atoms in a region within 10 nm of an interface between the semiconductor layer and the insulating film is greater than or equal to $1\times10^{21}$ cm$^{-3}$.

In addition, a silicon carbide semiconductor device according to the present invention includes a substrate made of silicon carbide and having an off-angle of greater than or equal to 50° and less than or equal to 65° with respect to a surface orientation of {0001}, a semiconductor layer and an insulating film. The semiconductor layer is formed on the substrate and is made of silicon carbide. The insulating film is formed to contact with a surface of the semiconductor layer. A maximum value of a concentration of hydrogen atoms in a region within 10 nm of an interface between the semiconductor layer and the insulating film is greater than or equal to $1\times10^{21}$ cm$^{-3}$.

In addition, a silicon carbide semiconductor device according to the present invention includes a substrate made of silicon carbide and having an off-angle of greater than or equal to 50° and less than or equal to 65° with respect to a surface orientation of {0001}, a semiconductor layer and an insulating film. The semiconductor layer is formed on the substrate and is made of silicon carbide. The insulating film is formed to contact with a surface of the semiconductor layer. A maximum value of a total concentration of nitrogen atoms and hydrogen atoms in a region within 10 nm of an interface between the semiconductor layer and the insulating film is greater than or equal to $1\times10^{21}$ cm$^{-3}$.

In this way, the mobility of carriers in the semiconductor layer in the vicinity of the interface between the insulating film and the semiconductor layer (for example, the channel mobility when the insulating film is used as the gate insulating film) can be increased as compared with the mobility when the nitrogen atoms or the hydrogen atoms are not contained in the vicinity of the interface, and the on-state resistance that is lower than that of a conventional semiconductor device using silicon can be achieved. Therefore, the silicon carbide semiconductor device with excellent electrical characteristics that exhibits sufficiently high carrier mobility (channel mobility) can be obtained.

It is noted that the reason why the lower limit of the off-angle is set to 50° is that, as given in data that will be described hereinafter, the carrier mobility is remarkably increased as the off-angle is increased from the (01-14) surface whose off-angle is 43.3° to the (01-13) surface whose off-angle is 51.5°, and that there is no natural surface within a range of the off-angle of the (01-14) surface to the off-angle of the (01-13) surface described above.

In addition, the reason why the upper limit of the off-angle is set to 65° is that the carrier mobility is remarkably decreased as the off-angle is increased from the (01-12) surface whose off-angle is 62.1° to the (01-10) surface whose off-angle is 90°, and that there is no natural surface within a range of the off-angle of the (01-12) surface to the off-angle of the (01-10) surface described above.

In a method for manufacturing a silicon carbide semiconductor device according to the present invention, a step of preparing a substrate made of silicon carbide and having an off-angle of greater than or equal to 50° and less than or equal to 65° with respect to a surface orientation of {0001} is first performed. A step of forming a semiconductor layer on the substrate is performed. Furthermore, a step of forming an insulating film to contact with a surface of the semiconductor layer is performed. A step of adjusting a concentration of nitrogen atoms in a region within 10 nm of an interface between the semiconductor layer and the insulating film such that a maximum value of the concentration of the nitrogen atoms is greater than or equal to $1 \times 10^{21}$ cm$^{-3}$ is performed.

In addition, in a method for manufacturing a silicon carbide semiconductor device according to the present invention, a step of preparing a substrate made of silicon carbide and having an off-angle of greater than or equal to 50° and less than or equal to 65° with respect to a surface orientation of {0001} is first performed. A step of forming a semiconductor layer on the substrate is performed. Furthermore, a step of forming an insulating film to contact with a surface of the semiconductor layer is performed. A step of adjusting a concentration of hydrogen atoms in a region within 10 nm of an interface between the semiconductor layer and the insulating film such that a maximum value of the concentration of the hydrogen atoms is greater than or equal to $1 \times 10^{21}$ cm$^{-3}$ is performed.

In addition, in a method for manufacturing a silicon carbide semiconductor device according to the present invention, a step of preparing a substrate made of silicon carbide and having an off-angle of greater than or equal to 50° and less than or equal to 65° with respect to a surface orientation of {0001} is first performed. A step of forming a semiconductor layer on the substrate is performed. Furthermore, a step of forming an insulating film to contact with a surface of the semiconductor layer is performed. A step of adjusting a total concentration of nitrogen atoms and hydrogen atoms in a region within 10 nm of an interface between the semiconductor layer and the insulating film such that a maximum value of the total concentration is greater than or equal to $1 \times 10^{21}$ cm$^{-3}$ is performed.

In this way, the silicon carbide semiconductor device having increased carrier mobility (channel mobility) according to the present invention can be readily manufactured.

Effects of the Invention

According to the present invention, a silicon carbide semiconductor device having high carrier mobility can be obtained.

Figure 1:
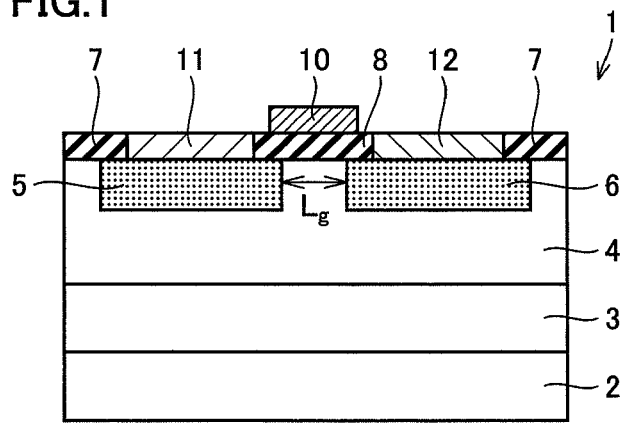
FIG. 1 is a schematic cross-sectional view of a semiconductor device according to the present invention.

DESCRIPTION OF THE REFERENCE SIGNS 1 semiconductor device, 2 substrate, 3 epitaxial layer, 4 p-type layer, 5, 6 n$^+$ region, 7, 8 oxide film, 10 gate electrode, 11 source electrode, 12 drain electrode, 15 opening, 21 buffer layer, 22 voltage maintained layer, 23 p region, 24 n$^+$ region, 25 p$^+$ region, 26 oxide film, 27 upper source electrode, 31 rear surface electrode, 41, 51 boundary region

BEST MODES FOR CARRYING OUT THE INVENTION

Embodiments of the present invention will be described hereinafter with reference to the drawings, wherein the same or corresponding portions are represented by the same reference numerals, and description thereof will not be repeated.

First Embodiment

A first embodiment of a semiconductor device according to the present invention will be described with reference to FIG. 1.

A semiconductor device 1 shown in FIG. 1 is a lateral MOSFET (Metal-Oxide-Semiconductor Field-Effect Transistor) serving as a silicon carbide semiconductor device, and includes a substrate 2 made of silicon carbide (SiC), an epitaxial layer 3 made of silicon carbide and formed on this substrate 2, a p-type layer 4 made of silicon carbide and formed on this epitaxial layer 3, $n^+$ regions 5 and 6 formed in a surface of p-type layer 4 with a spacing therebetween, an oxide film 8 serving as a gate insulating film and located on a channel region between these $n^+$ regions 5 and 6, a gate electrode 10 formed on this oxide film 8, and a source electrode 11 and a drain electrode 12 formed on $n^+$ regions 5 and 6, respectively. Substrate 2 is a substrate having, as a main surface, the (03-38) surface whose off-angle is about 53° with respect to the surface orientation of {0001}. Substrate 2 contains n-type conductive impurities.

Epitaxial layer 3 made of silicon carbide and formed on substrate 2 is an undoped layer. P-type layer 4 formed on this epitaxial layer 3 contains conductive impurities exhibiting the p-type. In addition, conductive impurities exhibiting the n-type are implanted into $n^+$ regions 5 and 6. Oxide films 7 and 8 are formed to cover these p-type layer 4 as well as $n^+$ regions 5 and 6. These oxide films 7 and 8 have openings formed in regions located on $n^+$ regions 5 and 6. Inside the openings, source electrode 11 and drain electrode 12 electrically connected to $n^+$ regions 5 and 6, respectively, are formed. Gate electrode 10 is arranged on oxide film 8 acting as the gate insulating film. A channel length $L_g$ that refers to the distance between $n^+$ regions 5 and 6 can be set to, for example, approximately 100 μm. In addition, the channel width can be set to, for example, approximately twice as large as above channel length $L_g$ (approximately 200 μm).

In the semiconductor device shown in FIG. 1, a maximum value of the concentration of nitrogen atoms in a region within 10 nm of an interface between p-type layer 4 serving as a semiconductor layer and oxide film 8 is greater than or equal to $1 \times 10^{21}$ cm$^{-3}$. As a result, the mobility (channel mobility) in the channel region having channel length $L_g$ (the region between $n^+$ regions 5 and 6 in p-type layer 4) can be set to a sufficiently large value. In addition, in semiconductor device 1 shown in FIG. 1, the interface state density in an energy level lower than 0.1 eV that of a conduction band is smaller than $1 \times 10^{12}$ cm$^{-2}$ eV$^{-1}$.

It is considered that the reason for this is as follows. If oxide film 8 is formed by thermal oxidation and the like, the interface state is considerably formed at the interface between oxide film 8 and p-type layer 4 serving as the semiconductor layer. If no measures are taken, the channel mobility in the channel region becomes extremely small as compared with a theoretical value. In order to address this problem, the nitrogen atoms are introduced into the interface region between oxide film 8 and p-type layer 4 as described above, so that the influence of the interface state described above can be reduced and the channel mobility can be enhanced.

A method for manufacturing the first embodiment of the semiconductor device according to the present invention will be described with reference to FIGS. 2 to 7.

Figure 2:
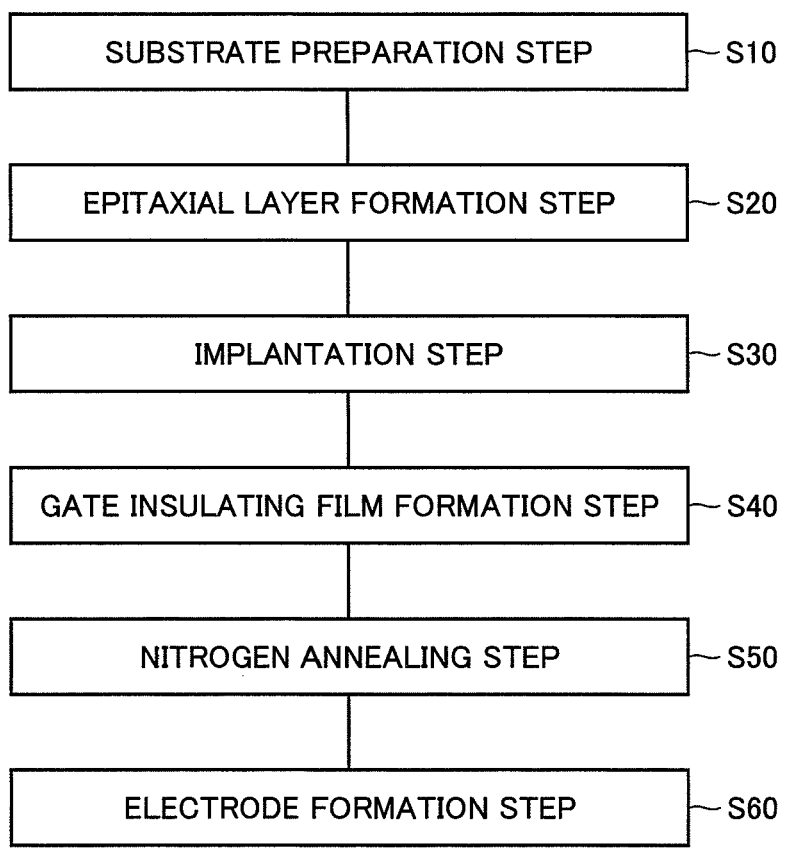
FIG. 2 is a flowchart for illustrating a method for manufacturing the semiconductor device shown in FIG. 1.

First, as shown in FIG. 2, a substrate preparation step (S10) is performed. Specifically, in this step, a silicon carbide substrate having, as the main surface, the surface orientation of (03-38) and having the n-type conductivity type is prepared as substrate 2. Such substrate can be obtained by using a method of cutting the substrate from an ingot having the (0001) surface as a main surface so as to expose the (03-38) surface as the main surface, for example.

Figure 3:
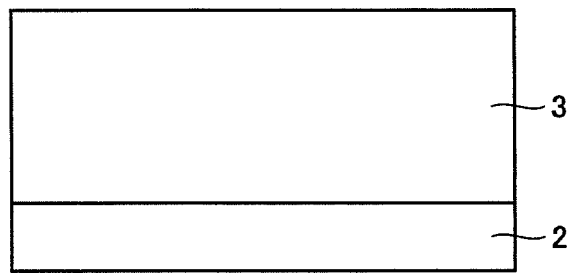
FIG. 3 is a schematic cross-sectional view for illustrating each step of the manufacturing method shown in FIG. 2.

Next, an epitaxial layer formation step (S20) is performed. Specifically, as shown in FIG. 3, undoped silicon carbide epitaxial layer 3 is formed on substrate 2.

Figure 4:
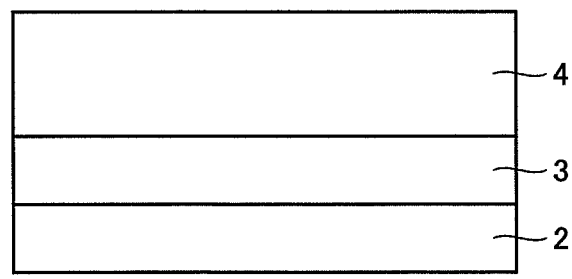
FIG. 4 is a schematic cross-sectional view for illustrating each step of the manufacturing method shown in FIG. 2.
Figure 5:
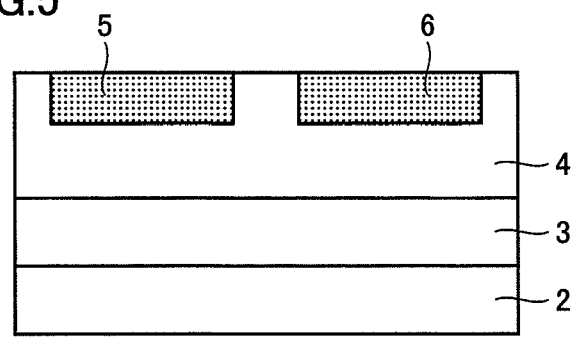
FIG. 5 is a schematic cross-sectional view for illustrating each step of the manufacturing method shown in FIG. 2.

Next, an implantation step (S30) is performed. Specifically, the conductive impurities exhibiting the p-type conductivity (for example, aluminum (Al)) are first implanted into epitaxial layer 3 to form p-type layer 4 as shown in FIG. 4. Next, the impurities exhibiting the n-type conductivity type are implanted to form $n^+$ regions 5 and 6 as shown in FIG. 5. Phosphorus (P), for example, can be used as these conductive impurities exhibiting the n-type. Any conventionally well-known method can be utilized to form these $n^+$ regions 5 and 6. For example, the oxide film is formed to cover an upper surface of p-type layer 4, and then, the openings having the same two-dimensional shape patterns as those of the regions where $n^+$ regions 5 and 6 should be formed are formed in the oxide film by photolithography and etching. Furthermore, this oxide film having the patterns formed is used as a mask and the conductive impurities are implanted. Thus, $n^+$ regions 5 and 6 described above can be formed.

Thereafter, an activation annealing process for activating the implanted impurities is performed. In this activation annealing process, a condition that the heating temperature is 1700° C. and the heating time is 30 minutes may be used, for example.

Figure 6:
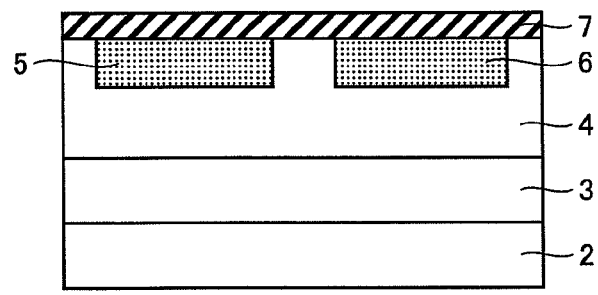
FIG. 6 is a schematic cross-sectional view for illustrating each step of the manufacturing method shown in FIG. 2.

Next, as shown in FIG. 2, a gate insulating film formation step (S40) is performed. Specifically, upper surfaces of p-type layer 4 as well as $n^+$ regions 5 and 6 are subjected to a sacrificial oxidation process, and then, oxide film 7 serving as the gate insulating film is formed as shown in FIG. 6. A value of, for example, 40 nm can be used as the thickness of oxide film 7.

Next, as shown in FIG. 2, a nitrogen annealing step (S50) is performed. Specifically, a nitric oxide (NO) gas is used as an atmosphere gas for heat treatment. As a condition for this heat treatment, a condition that the heating temperature is 1100° C. and the heating time is one hour can be used, for example. As a result, the nitrogen atoms can be introduced into the interface region between oxide film 7 and p-type layer 4 and $n^+$ regions 5, 6. In this nitrogen annealing step, an annealing step that an inert gas is used, e.g., an annealing step that an argon (Ar) gas is used as the atmosphere gas may be performed after the above annealing step that the atmosphere gas containing the nitrogen atoms is used.

Figure 7:
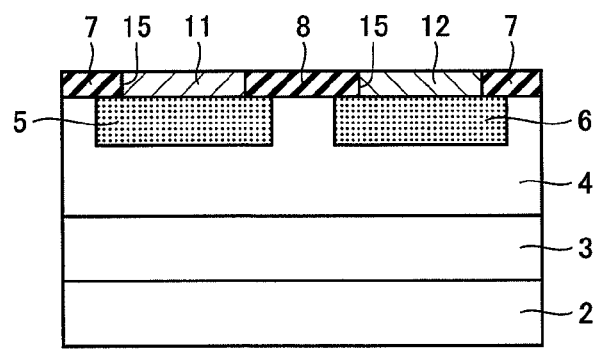
FIG. 7 is a schematic cross-sectional view for illustrating each step of the manufacturing method shown in FIG. 2.

Next, as shown in FIG. 2, an electrode formation step (S60) is performed. Specifically, a resist film having a pattern is formed on oxide film 7 by using the photolithography method. This resist film is used as a mask and oxide film 7 is partially removed to form openings 15 in the regions located on $n^+$ regions 5 and 6. Inside these openings 15, a conductor film that should form source electrode 11 and drain electrode 12 as shown in FIG. 7 is formed. This conductor film is formed with the above resist film left. Thereafter, the above resist film is removed and the conductor film located on oxide film 7 is removed (lifted off) together with the resist film, so that source electrode 11 and drain electrode 12 can be formed as shown in FIG. 7. It is noted that oxide film 8 (a part of oxide film 7 shown in FIG. 6) located between source electrode 11 and drain electrode 12 at this time will form the gate insulating film for the semiconductor device that will be formed.

Thereafter, gate electrode 10 (see FIG. 1) is further formed on oxide film 8 acting as the gate insulating film. The following method can be used as a method for forming this gate electrode 10. For example, a resist film having a pattern of an opening located at a region on oxide film 8 is formed in advance, and a conductor film that will form the gate electrode is formed to cover the whole surface of the resist film. Then, the resist film is removed and the conductor film other than a portion of the conductor film that should form the gate electrode is removed (lifted off). As a result, gate electrode 10 is formed as shown in FIG. 1. Thus, the semiconductor device as shown in FIG. 1 can be obtained.

Second Embodiment

A second embodiment of a semiconductor device according to the present invention will be described with reference to FIG. 8.

Figure 8:
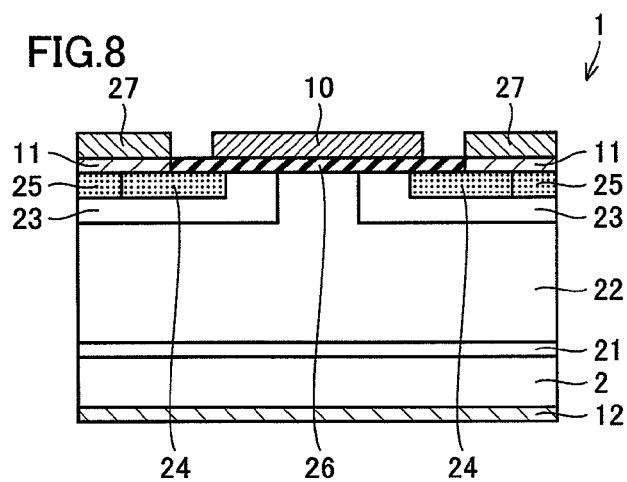
FIG. 8 is a schematic cross-sectional view of a second embodiment of a semiconductor device according to the present invention.

Referring to FIG. 8, a semiconductor device 1 according to the present invention is a vertical DiMOSFET (Double Implanted MOSFET) and includes a substrate 2, a buffer layer 21, a voltage maintained layer 22, a p region 23, an $n^+$ region 24, a $p^+$ region 25, an oxide film 26, a source electrode 11 and an upper source electrode 27, a gate electrode 10, and a drain electrode 12 formed on the rear surface side of substrate 2. Specifically, buffer layer 21 made of silicon carbide is formed on a surface of substrate 2 made of silicon carbide having the n conductivity type. This buffer layer 21 has the n-type conductivity type and has a thickness of, for example, 0.5 µm. In addition, the concentration of n-type conductive impurities in the buffer layer can be set to, for example, $5 \times 10^{17}$ cm$^{-3}$. Voltage maintained layer 22 is formed on this buffer layer 21. This voltage maintained layer 22 is made of silicon carbide having the n-type conductivity type and has a thickness of, for example, 10 µm. In addition, a value of $5 \times 10^{15}$ cm$^{-3}$ can be used as the concentration of n-type conductive impurities in voltage maintained layer 22.

In a surface of this voltage maintained layer 22, p regions 23 having the p-type conductivity type are formed with a spacing therebetween. Within p region 23, $n^+$ region 24 is formed in a surface layer of p region 23. In addition, $p^+$ region 25 is formed at the location adjacent to this $n^+$ region 24. Oxide film 26 is formed to extend from a position on $n^+$ region 24 in one p region 23 through p region 23, voltage maintained layer 22 exposed between two p regions 23, and the other p region 23 to a position on $n^+$ region 24 in the other p region 23. Gate electrode 10 is formed on oxide film 26. In addition, source electrode 11 is formed on $n^+$ region 24 and $p^+$ region 25. Upper source electrode 27 is formed on this source electrode 11. Drain electrode 12 is formed on a rear surface opposite to the surface where buffer layer 21 is formed.

A maximum value of the concentration of nitrogen atoms in a region within 10 nm of an interface between oxide film 26 and $n^+$ region 24, $p^+$ region 25, p region 23, and voltage maintained layer 22 serving as a semiconductor layer is greater than or equal to $1 \times 10^{21}$ cm$^{-3}$. In this way, the mobility especially in a channel region under oxide film 26 (a portion of p region 23 between $n^+$ region 24 and voltage maintained layer 22, which comes into contact with oxide film 26) can be enhanced, as is the case with the semiconductor device shown in FIG. 1. In addition, even in semiconductor device 1 shown in FIG. 8, the interface state density in an energy level lower than 0.1 eV that of a conduction band is smaller than $1 \times 10^{12}$ cm$^{-2}$ eV$^{-1}$.

Next, a method for manufacturing the semiconductor device shown in FIG. 8 will be described with reference to FIGS. 9 to 12.

A substrate preparation step (S10) is first performed similarly to the method for manufacturing the semiconductor device shown in FIG. 2. Here, similarly to the method for manufacturing the semiconductor device in the first embodiment of the present invention, substrate 2 (see FIG. 9) made of silicon carbide and having the (03-38) surface as a main surface is prepared.

Figure 9:
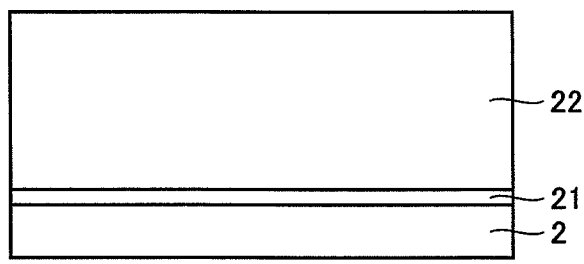
FIG. 9 is a schematic cross-sectional view for illustrating a method for manufacturing the semiconductor device shown in FIG. 8.

In addition, a substrate having the n-type conductivity type and having a substrate resistance of 0.02 Ωcm, for example, may be used as this substrate 2 (see FIG. 9).

Next, an epitaxial layer formation step (S20) is performed. Specifically, buffer layer 21 is formed on the surface of substrate 2. As the buffer layer, an epitaxial layer made of silicon carbide having the n-type conductivity type and having a thickness of, for example, 0.5 µm is formed. A value of, for example, $5 \times 10^{17}$ cm$^{-3}$ can be used as the concentration of the conductive impurities in buffer layer 21. Then, voltage maintained layer 22 is formed on this buffer layer 21 as shown in FIG. 9. A layer made of silicon carbide having the n-type conductivity type is formed as this voltage maintained layer 22 by using an epitaxial growth method. A value of, for example, 10 µm can be used as the thickness of this voltage maintained layer 22. In addition, a value of, for example, $5 \times 10^{15}$ cm$^{-3}$ can be used as the concentration of the n-type conductive impurities in this voltage maintained layer 22.

Figure 10:
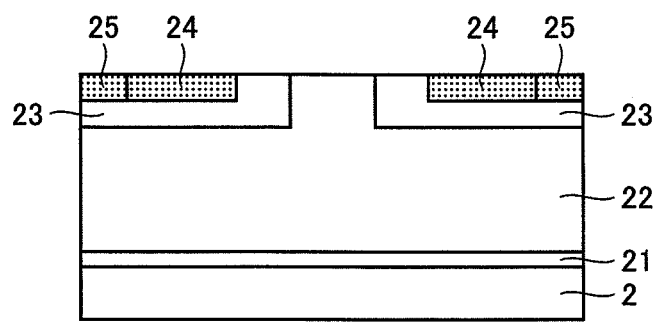
FIG. 10 is a schematic cross-sectional view for illustrating the method for manufacturing the semiconductor device shown in FIG. 8.

Next, an implantation step (S30) is performed similarly to the step shown in FIG. 2. Specifically, an oxide film formed by using photolithography and etching is used as a mask and the impurities having the p-type conductivity type are implanted into voltage maintained layer 22 to form p region 23 as shown in FIG. 10. The used oxide film is removed, and then, an oxide film having a new pattern is again formed by using photolithography and etching. Then, the oxide film is used as a mask and the n-type conductive impurities are implanted into a prescribed region to form $n^+$ region 24. In addition, by using the similar method, the conductive impurities having the p-type conductivity type are implanted to form $p^+$ region 25. As a result, the structure as shown in FIG. 10 is obtained.

After the implantation step as described above, an activation annealing process is performed. In this activation annealing process, the argon gas can be used as the atmosphere gas, for example, and a condition that the heating temperature is 1700° C. and the heating time is 30 minutes can be used.

Figure 11:
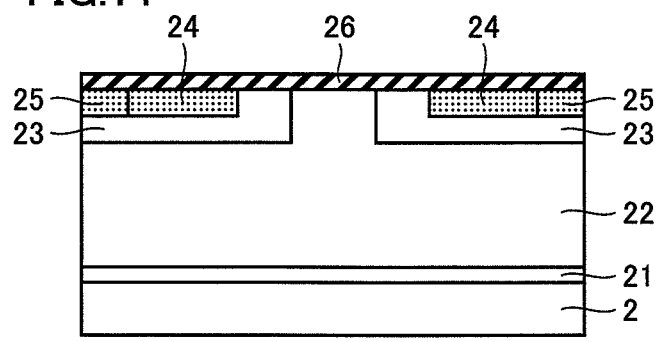
FIG. 11 is a schematic cross-sectional view for illustrating the method for manufacturing the semiconductor device shown in FIG. 8.

Next, a gate insulating film formation step (S40) is performed similarly to the step shown in FIG. 2. Specifically, as shown in FIG. 11, oxide film 26 is formed to cover portions on voltage maintained layer 22, p region 23, $n^+$ region 24, and $p^+$ region 25. As a condition for forming this oxide film 26, dry oxidation (thermal oxidation) may be performed, for example. A condition that the heating temperature is 1200° C. and the heating time is 30 minutes can be used as a condition for this dry oxidation.

Thereafter, a nitrogen annealing step (S50) is performed similarly to the step shown in FIG. 2. Specifically, nitric oxide (NO) is used as the atmosphere gas to perform the annealing process. As a temperature condition for the annealing process, the heating temperature is set to 1100° C. and the heating time is set to 120 minutes, for example. As a result, the nitrogen atoms are introduced in the vicinity of the interface between oxide film 26 and voltage maintained layer 22, p region 23, n+ region 24, and p+ region 25 that are lower layers. In addition, after this annealing step that the nitric oxide is used as the atmosphere gas, additional annealing may be performed by using the argon (Ar) gas that is the inert gas. Specifically, the argon gas may be used as the atmosphere gas, and a condition that the heating temperature is 1100° C. and the heating time is 60 minutes may be used.

Figure 12:
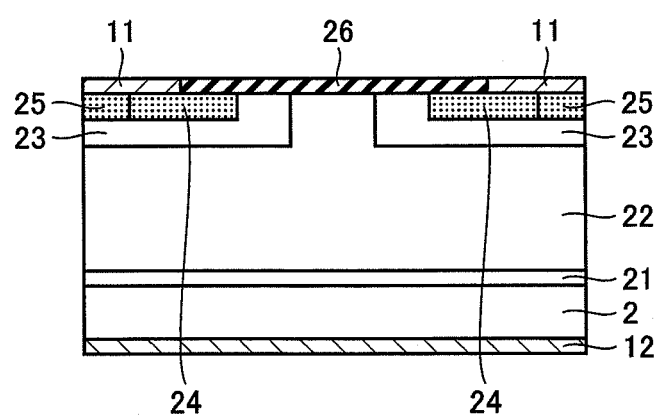
FIG. 12 is a schematic cross-sectional view for illustrating the method for manufacturing the semiconductor device shown in FIG. 8.

Next, an electrode formation step (S60) is performed similarly to the step shown in FIG. 2. Specifically, a resist film having a pattern is formed on oxide film 26 by using the photolithography method. The resist film is used as a mask and a portion of the oxide film located on n+ region 24 and p+ region 25 is removed by etching. Thereafter, a conductor film such as metal is formed on the resist film and is formed inside the opening formed in oxide film 26 to contact with n+ region 24 and p+ region 25. Thereafter, the resist film is removed and the conductor film located on the resist film is removed (lifted off). Here, nickel (Ni), for example, can be used as a conductor. As a result, as shown in FIG. 12, source electrode 11 and drain electrode 12 can be obtained. It is noted that heat treatment for alloying is preferably performed at this time. Specifically, the argon (Ar) gas that is the inert gas is used as the atmosphere gas, for example, and the heat treatment (alloying process) is performed under the condition that the heating temperature is 950° C. and the heating time is 2 minutes.

Thereafter, upper source electrode 27 (see FIG. 8) is formed on source electrode 11. In addition, drain electrode 12 (see FIG. 8) is formed on the rear surface of substrate 2. Thus, the semiconductor device shown in FIG. 8 can be obtained.

Third Embodiment

Figure 13:
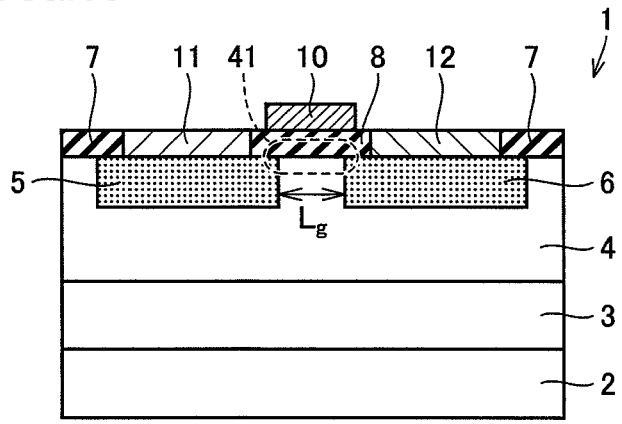
FIG. 13 is a schematic cross-sectional view of a third embodiment of a semiconductor device according to the present invention.

A third embodiment of a semiconductor device according to the present invention will be described with reference to FIG. 13. Referring to FIG. 13, a semiconductor device 1 according to the present invention basically has a configuration similar to that of semiconductor device 1 shown in FIG. 1. Semiconductor device 1 according to the present invention, however, differs from semiconductor device 1 shown in FIG. 1 in that a maximum value of the concentration of hydrogen atoms in a boundary region 41 including a region within 10 nm of an interface between a p-type layer 4 serving as a semiconductor layer and an oxide film 8 is greater than or equal to $1 \times 10^{21}$ cm$^{-3}$. Even in such a configuration, the mobility (channel mobility) in a channel region including boundary region 41 can be set to a sufficiently large value, as is the case with the semiconductor device shown in FIG. 1. It is considered that this is because the hydrogen atoms contained in boundary region 41 reduce the interface state in semiconductor device 1 shown in FIG. 13, similarly to the nitrogen atoms contained in the region within 10 nm of the interface between p-type layer 4 and oxide film 8 of semiconductor device 1 shown in FIG. 1. In other words, even in the semiconductor device shown in FIG. 13, the interface state density in an energy level lower than 0.1 eV that of a conduction band is smaller than $1 \times 10^{12}$ cm$^{-2}$ eV$^{-1}$.

A method for manufacturing the third embodiment of the semiconductor device according to the present invention will be described with reference to FIG. 14.

Figure 14:
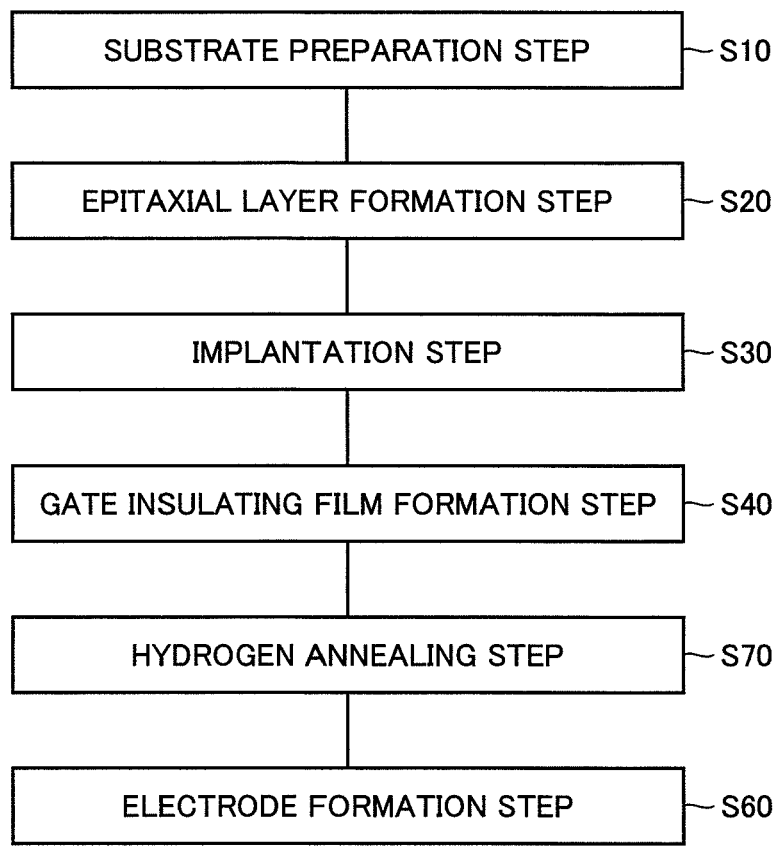
FIG. 14 is a flowchart for illustrating a method for manufacturing the semiconductor device shown in FIG. 13.

The method for manufacturing the semiconductor device shown in FIG. 14 is basically similar to the method for manufacturing the semiconductor device shown in FIG. 2. The method for manufacturing the semiconductor device shown in FIG. 14, however, differs from the method for manufacturing the semiconductor device shown in FIG. 2 in that a hydrogen annealing step (S70) is performed instead of the nitrogen annealing step (S50) in FIG. 2. Specifically, a substrate preparation step (S10), an epitaxial layer formation step (S20), an implantation step (S30), and a gate insulating film formation step (S40) are performed similarly to the manufacturing method shown in FIG. 2. Thereafter, the hydrogen annealing step (S70) is performed. Specifically, a hydrogen gas (H$_2$) is used as the atmosphere gas for heat treatment. As a condition for this heat treatment, a condition that the heating temperature is 1100° C. and the heating time is one hour can be used, for example. As a result, the hydrogen atoms can be introduced into an interface region between an oxide film 7 and p-type layer 4 and n+ regions 5, 6. In addition, in this hydrogen annealing step, an annealing step that the inert gas is used, e.g., an annealing step that the argon (Ar) gas is used as the atmosphere gas may be performed after the above annealing step that the atmosphere gas containing the hydrogen atoms is used. Moreover, in the above hydrogen annealing step (S70), water vapor or water vapor-containing hydrogen gas may be used as the atmosphere gas instead of the hydrogen gas.

Thereafter, as shown in FIG. 14, an electrode formation step (S60) is performed similarly to the manufacturing method shown in FIG. 2, and thus, semiconductor device 1 shown in FIG. 13 can be obtained.

Fourth Embodiment

A fourth embodiment of a semiconductor device according to the present invention will be described with reference to FIG. 15.

Figure 15:
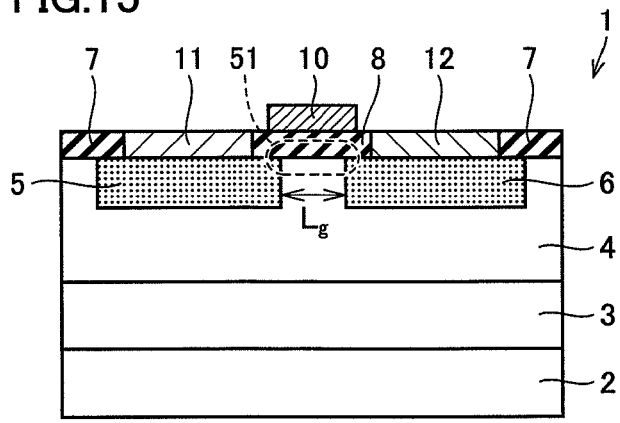
FIG. 15 is a schematic cross-sectional view of a fourth embodiment of a semiconductor device according to the present invention.

Referring to FIG. 15, a semiconductor device 1 according to the present invention basically has a configuration similar to that of semiconductor device 1 shown in FIG. 1. Semiconductor device 1 according to the present invention, however, differs from semiconductor device 1 shown in FIG. 1 in that a maximum value of the total concentration of nitrogen atoms and hydrogen atoms in a boundary region 51 including a region within 10 nm of an interface between a p-type layer 4 serving as a semiconductor layer and an oxide film 8 is greater than or equal to $1 \times 10^{21}$ cm$^{-3}$. Even in such a configuration, the mobility (channel mobility) in a channel region including boundary region 51 can be set to a sufficiently large value, as is the case with the semiconductor device shown in FIG. 1. In addition, even in the semiconductor device shown in FIG. 15, the interface state density in an energy level lower than 0.1 eV that of a conduction band is smaller than $1 \times 10^{12}$ cm$^{-2}$ eV$^{-1}$.

A method for manufacturing the fourth embodiment of the semiconductor device according to the present invention will be described with reference to FIG. 16.

Figure 16:
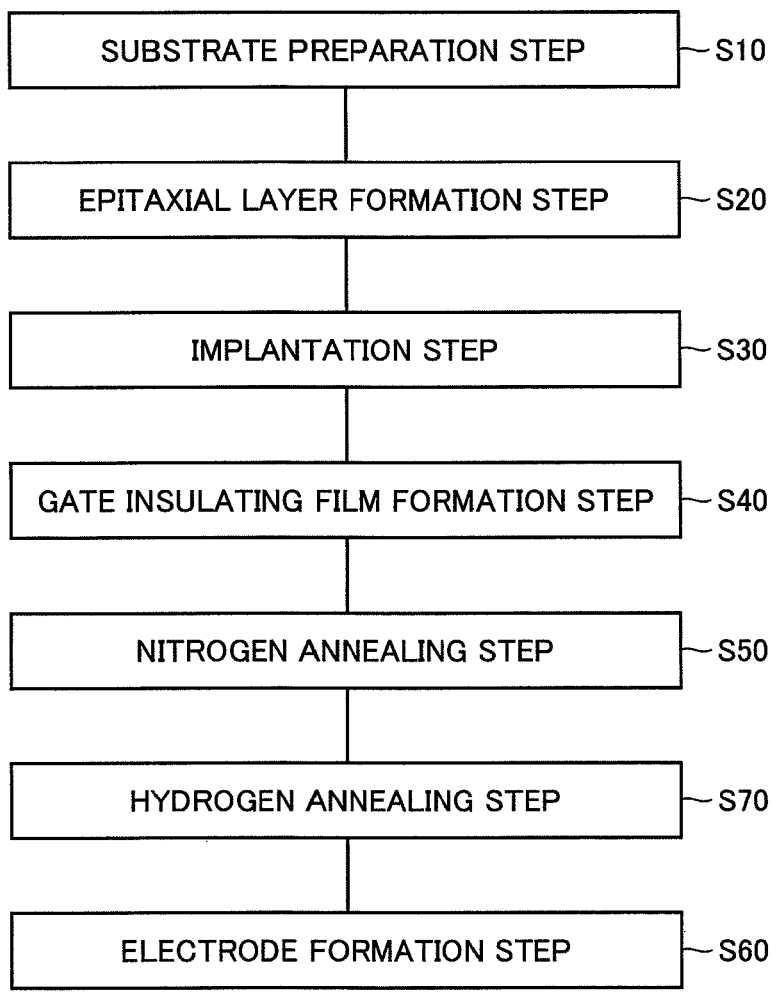
FIG. 16 is a flowchart for illustrating a method for manufacturing the semiconductor device shown in FIG. 15.

The method for manufacturing the semiconductor device shown in FIG. 16 is basically similar to the method for manufacturing the semiconductor device shown in FIG. 2. The method for manufacturing the semiconductor device shown in FIG. 16, however, differs from the method for manufacturing the semiconductor device shown in FIG. 2 in that a hydrogen annealing step (S70) is performed after a nitrogen annealing step (S50) and before an electrode formation step (S60) in FIG. 16. Specifically, a substrate preparation step (S10), an epitaxial layer formation step (S20), an implantation step (S30), a gate insulating film formation step (S40), and the nitrogen annealing step (S50) are performed similarly to the manufacturing method shown in FIG. 2. Thereafter, the hydrogen annealing step (S70) is performed. In this step (S70), a condition similar to that for the hydrogen annealing step (S70) in the manufacturing method in the third embodiment (the condition for annealing where the hydrogen gas is used) can be used. As a result, the nitrogen atoms and the hydrogen atoms can be introduced into an interface region between an oxide film 7 and p-type layer 4 and n+ regions 5,

6. It is noted that, in the above hydrogen annealing step (S70), water vapor or water vapor-containing oxygen gas may be used as the atmosphere gas instead of the hydrogen gas. In addition, the hydrogen annealing step (S70) may be performed before the nitrogen annealing step (S50). Moreover, the hydrogen annealing step (S70) and the nitrogen annealing step (S50) may be simultaneously performed by heat treatment that the atmosphere gas containing the hydrogen atoms and the nitrogen atoms is used.

Thereafter, as shown in FIG. 16, the electrode formation step (S60) is performed similarly to the manufacturing method shown in FIG. 2, and thus, semiconductor device 1 shown in FIG. 15 can be obtained.

A modification of the method for manufacturing the fourth embodiment of the semiconductor device according to the present invention will be described with reference to FIG. 17.

Figure 17:
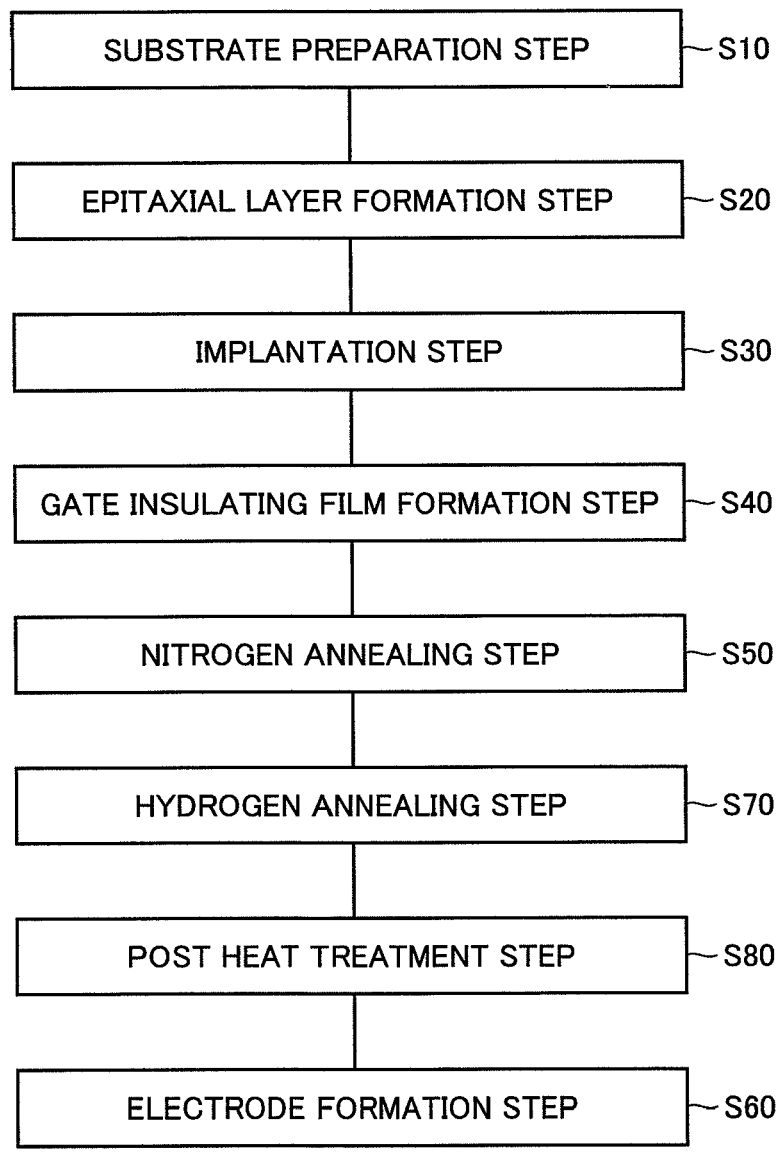
FIG. 17 is a flowchart for a modification of the method for manufacturing the semiconductor device shown in FIG. 16.

A method for manufacturing a semiconductor device shown in FIG. 17 is basically similar to the method for manufacturing the semiconductor device shown in FIG. 16. The method for manufacturing the semiconductor device shown in FIG. 17, however, differs from the method for manufacturing the semiconductor device shown in FIG. 16 in that a post heat treatment step (S80) is performed after the hydrogen annealing step (S70) and before the electrode formation step (S60) in FIG. 16. Specifically, a substrate preparation step (S10), an epitaxial layer formation step (S20), an implantation step (S30), a gate insulating film formation step (S40), a nitrogen annealing step (S50), and a hydrogen annealing step (S70) are performed similarly to the manufacturing method shown in FIG. 16. Thereafter, the post heat treatment step (S80) is performed. Specifically, an annealing step that the inert gas is used is performed. As a condition for this annealing step, the inert gas (for example, argon (Ar)) can be used as the atmosphere gas, and a condition that the heating temperature is 1100° C. and the heating time is 60 minutes can be used. Such annealing step that the inert gas is used allows more reliable production of an effect of reducing the interface state by the nitrogen atoms and the hydrogen atoms introduced into a channel region through the nitrogen annealing step (S50) and the hydrogen annealing step (S70).

Thereafter, as shown in FIG. 17, an electrode formation step (S60) is performed similarly to the manufacturing method shown in FIG. 2, and thus, semiconductor device 1 shown in FIG. 15 can be obtained.

It is noted that a heat treatment step similar to the above post heat treatment step (S80) may be additionally performed between the nitrogen annealing step (S50) and the hydrogen annealing step (S70). In addition, in addition, in the manufacturing method shown in FIG. 17, the hydrogen annealing step (S70) may also be performed before the nitrogen annealing step (S50). Moreover, the hydrogen annealing step (S70) and the nitrogen annealing step (S50) may be simultaneously performed by heat treatment that the atmosphere gas containing the hydrogen atoms and the nitrogen atoms is used.

Although the lateral MOSFET is shown as semiconductor device 1 in the third and fourth embodiments described above, the characteristics of the third and fourth embodiments may be applied to the vertical DiMOSFET shown in FIG. 8. In other words, in semiconductor device 1 shown in FIG. 8, the maximum value of the concentration of the hydrogen atoms in the region within 10 nm of the interface between oxide film 26 and n⁺ region 24, p⁺ region 25, p region 23, and voltage maintained layer 22 serving as the semiconductor layer, or the maximum value of the total concentration of the nitrogen atoms and the hydrogen atoms can be set to greater than or equal to $1\times10^{21}$ cm$^{-3}$.

In addition, it is preferable that substrate 2 forming semiconductor device 1 shown in the above first to fourth embodiments has an off-orientation in a range of less than or equal to ±5° in the <11-20> direction or in a range of less than or equal to ±5° in the <01-10> direction. Moreover, it is more preferable that the main surface of substrate 2 forming semiconductor device 1 in the above first to fourth embodiments has a surface orientation whose off-angle is greater than or equal to −3° and less than or equal to +5° with respect to the surface orientation of {03-38}.

Here, the characteristic configuration of the present invention will be enumerated, a part of which overlaps those in the above embodiments.

A semiconductor device 1 serving as a silicon carbide semiconductor device according to the present invention includes a substrate 2 made of silicon carbide and having an off-angle of greater than or equal to 50° and less than or equal to 65° with respect to a surface orientation of {0001}, a semiconductor layer (p-type layer 4 in FIG. 1, p region 23 in FIG. 8), and an insulating film (oxide film 8 in FIG. 1, oxide film 26 in FIG. 8). The semiconductor layer (p-type layer 4, p region 23) is formed on substrate 2 and is made of silicon carbide. The insulating film (oxide film 8, 26) is formed to contact with a surface of the semiconductor layer (p-type layer 4 including the channel region, p region 23). A maximum value of a concentration of nitrogen atoms in a region within 10 nm of an interface between the semiconductor layer and the insulating film (interface between the channel region and oxide film 8, 26) is greater than or equal to $1\times10^{21}$ cm$^{-3}$.

In this way, the mobility of carriers (channel mobility) in a channel region in the vicinity of the interface between oxide film 8, 26 acting as a gate insulating film and the channel region can be increased as compared with a case where the nitrogen atoms are not contained in the vicinity of the interface, and the on-state resistance that is lower than that of the conventional semiconductor device using silicon can be achieved. Therefore, semiconductor device 1 with excellent electrical characteristics that exhibits sufficiently high channel mobility can be obtained. It is noted that the reason why the maximum value of the concentration of the nitrogen atoms is set to greater than or equal to $1\times10^{21}$ cm$^{-3}$ as described above is that, when the concentration of the nitrogen atoms is set to greater than or equal to the above value, the channel mobility can be set to a practically sufficient value, that is, greater than or equal to 50 cm$^2$/Vs.

In above semiconductor device 1, hydrogen atoms may be contained in the region within 10 nm of the interface between the semiconductor layer (p-type layer 4 in FIG. 1, p region 23 in FIG. 8) and the insulating film (oxide film 8, 26). In this case, the interface state in the region can be reduced more reliably.

A semiconductor device 1 serving as a silicon carbide semiconductor device according to the present invention includes a substrate 2 made of silicon carbide and having an off-angle of greater than or equal to 50° and less than or equal to 65° with respect to a surface orientation of {0001}, a semiconductor layer (p-type layer 4 in FIG. 13, p region 23 in FIG. 8), and an insulating film (oxide film 8 in FIG. 13, oxide film 26 in FIG. 8). The semiconductor layer (p-type layer 4, p region 23) is formed on substrate 2 and is made of silicon carbide. The insulating film (oxide film 8, 26) is formed to contact with a surface of the semiconductor layer (p-type layer 4 including the channel region, p region 23). A maximum value of a concentration of hydrogen atoms in a region within 10 nm of an interface between the semiconductor layer and the insulating film (for example, an interface between the channel region and oxide film 8, 26 included in boundary region 41 in FIG. 13) is greater than or equal to $1\times10^{21}$ cm$^{-3}$.

In this way, the mobility of carriers in a channel region in the vicinity of the interface between oxide film 8, 26 acting as a gate insulating film and the channel region can be increased as compared with a case where the hydrogen atoms are not contained in the vicinity of the interface, and the on-state resistance that is lower than that of the conventional semiconductor device using silicon can be achieved. It is noted that the reason why the maximum value of the concentration of the hydrogen atoms is set to greater than or equal to $1\times10^{21}$ cm$^{-3}$ as described above is that, when the concentration of the hydrogen atoms is set to greater than or equal to the above value, the channel mobility can be set to a practically sufficient value, that is, greater than or equal to 50 cm$^2$/Vs.

In above semiconductor device 1, nitrogen atoms may be contained in the region within 10 nm of the interface between the semiconductor layer (p-type layer 4 in FIG. 13, p region 23 in FIG. 8) and the insulating film (oxide film 8 in FIG. 13, oxide film 26 in FIG. 8). In this case, the interface state in the region can be reduced more reliably.

A semiconductor device 1 serving as a silicon carbide semiconductor device according to the present invention includes a substrate 2 made of silicon carbide and having an off-angle of greater than or equal to 50° and less than or equal to 65° with respect to a surface orientation of {0001}, a semiconductor layer (p-type layer 4 in FIG. 15, p region 23 in FIG. 8), and an insulating film (oxide film 8 in FIG. 15, oxide film 26 in FIG. 8). The semiconductor layer (p-type layer 4, p region 23) is formed on substrate 2 and is made of silicon carbide. The insulating film (oxide film 8, 26) is formed to contact with a surface of the semiconductor layer (p-type layer 4 including the channel region, p region 23). A maximum value of a total concentration of nitrogen atoms and hydrogen atoms in a region within 10 nm of an interface between the semiconductor layer and the insulating film (for example, an interface between the channel region and oxide film 8, 26 included in boundary region 51 in FIG. 15) is greater than or equal to $1\times10^{21}$ cm$^{-3}$.

In this way, the mobility of carriers in the channel region in the vicinity of the interface between oxide film 8, 26 acting as a gate insulating film and the channel region can be increased as compared with a case where the nitrogen atoms and the hydrogen atoms are not contained in the vicinity of the interface, and the on-state resistance that is lower than that of the conventional semiconductor device using silicon can be achieved. It is noted that the reason why the maximum value of the total concentration of the nitrogen atoms and the hydrogen atoms is set to greater than or equal to $1\times10^{21}$ cm$^{-3}$ as described above is that, when the total concentration is set to greater than or equal to the above value, the channel mobility can be set to a practically sufficient value, that is, greater than or equal to 50 cm$^2$/Vs.

In above semiconductor device 1, an interface state density in an energy level lower than 0.1 eV that of a conduction band is preferably smaller than $1\times10^{12}$ cm$^{-2}$ eV$^{-1}$. In this case, the interface state density as described above allows the mobility of the carriers in the channel region to be sufficiently increased. It is noted that, when the above interface state density is larger than $1\times10^{12}$ cm$^{-2}$ eV$^{-1}$, the channel mobility in semiconductor device 1 falls below 50 cm$^2$/Vs that is considered as the practically sufficient value, and therefore, it is preferable to set a value of the interface state density to smaller than $1\times10^{12}$ cm$^{-2}$ eV$^{-1}$ as described above.

In above semiconductor device 1, substrate 2 may have an off-orientation in a range of less than or equal to ±5° in a <11-20> direction. In addition, substrate 2 made of silicon carbide may be a SiC substrate having a 4H polytype. In above semiconductor device 1, substrate 2 may have an off-orientation in a range of less than or equal to ±5° in a <01-10> direction. In this case, the above off-orientation is a typical off-orientation in the SiC substrate having the 4H polytype, and an epitaxial layer can be readily formed on the SiC substrate. It is noted that, in consideration of processing variations during slicing of the substrate, the range of the off-orientation is set to less than or equal to ±5°, respectively.

In above semiconductor device 1, a main surface of substrate 2 may have a surface orientation whose off-angle is greater than or equal to −3° and less than or equal to +5° with respect to a surface orientation of {03-38}. In addition, more preferably, the main surface of the substrate has the surface orientation of substantially {03-38}, and still more preferably, the main surface of the substrate has the surface orientation of {03-38}. Here, a state in which the main surface of the substrate has the surface orientation of substantially {03-38} means that, because of the processing accuracy and the like of the substrate, the surface orientation of the main surface of the substrate is within the range of the off-angle where the surface orientation can be regarded as substantially {03-38}. The range of the off-angle in this case is such that the off-angle is ±2° with respect to {03-38}, for example. In this case, the carrier mobility (channel mobility) described above can be maximized.

It is noted that the reason why the range of the off-angle in an arbitrary direction with respect to the surface orientation of {03-38} is set to greater than or equal to −3° and less than or equal to +5° is that, as can be seen from data that will be described hereinafter, at least the above range can be considered as the range of the off-angle where the channel mobility of greater than or equal to approximately 90 cm$^2$/Vs that is considered as the excellent carrier mobility (channel mobility) is obtained.

In a method for manufacturing a silicon carbide semiconductor device according to the present invention, a step of preparing a substrate 2 made of silicon carbide and having an off-angle of greater than or equal to 50° and less than or equal to 65° with respect to a surface orientation of {0001} (substrate preparation step (S10)) is first performed. A step of forming a semiconductor layer on substrate 2 (epitaxial layer formation step (S20)) is performed. Furthermore, a step of forming an insulating film to contact with a surface of the semiconductor layer (gate insulating film formation step (S40)) is performed. A step of adjusting a concentration of nitrogen atoms in a region within 10 nm of an interface between the semiconductor layer and the insulating film such that a maximum value of the concentration of the nitrogen atoms is greater than or equal to $1\times10^{21}$ cm$^{-3}$ (nitrogen annealing step (S50)) is performed. In this way, a semiconductor device 1 according to the present invention having increased carrier mobility (channel mobility) can be readily manufactured.

The above method for manufacturing a silicon carbide semiconductor device may further include a step of introducing hydrogen atoms into the region within 10 nm of the interface between the semiconductor layer (p-type layer 4, p region 23) and the insulating film (oxide film 8, 26) (for example, hydrogen annealing step (S70) in FIG. 16 or 17). In this case, the silicon carbide semiconductor device containing the hydrogen atoms in addition to the nitrogen atoms can be readily manufactured in the above region.

In the above method for manufacturing a silicon carbide semiconductor device, the step of introducing hydrogen atoms (hydrogen annealing step (S70)) includes a step of using a gas containing the hydrogen atoms as an atmosphere gas for heat treatment of the substrate where the insulating film (oxide film 8, 26) is formed. In this case, the concentration of the hydrogen atoms in the vicinity of the interface between the semiconductor layer (p-type layer 4 including the channel region, p region 23) and oxide film 8, 26 can be readily adjusted.

In the above method for manufacturing a silicon carbide semiconductor device, the step of introducing hydrogen atoms (hydrogen annealing step (S70)) may include a step of using the gas containing the hydrogen atoms as the atmosphere gas for heat treatment, and then, using an inert gas as the atmosphere gas for heat treatment of the substrate. In this case, the carrier mobility in semiconductor device 1 can be further increased.

In the above method for manufacturing a silicon carbide semiconductor device, the nitrogen annealing step (S50) may include a step of using a gas containing the nitrogen atoms as an atmosphere gas for heat treatment of substrate 2 where the insulating film (oxide film 8, 26) is formed. In this case, the concentration of the nitrogen atoms in the vicinity of the interface between the semiconductor layer (p-type layer 4 including the channel region, p region 23) and oxide film 8, 26 can be readily adjusted.

In the above method for manufacturing a silicon carbide semiconductor device, the nitrogen annealing step (S50) may include a step of using the above gas containing the nitrogen atoms as the atmosphere gas for heat treatment, and then, using an inert gas (Ar gas) as the atmosphere gas for heat treatment of substrate 2. In this case, the carrier mobility in semiconductor device 1 can be further increased.

In a method for manufacturing a silicon carbide semiconductor device according to the present invention, a step of preparing a substrate 2 made of silicon carbide and having an off-angle of greater than or equal to 50° and less than or equal to 65° with respect to a surface orientation of {0001} (substrate preparation step (S10)) is first performed. A step of forming a semiconductor layer on substrate 2 (epitaxial layer formation step (S20)) is performed. Furthermore, a step of forming an insulating film to contact with a surface of the semiconductor layer (gate insulating film formation step (S40)) is performed. A step of adjusting a concentration of hydrogen atoms in a region within 10 nm of an interface between the semiconductor layer and the insulating film such that a maximum value of the concentration of the hydrogen atoms is greater than or equal to $1 \times 10^{21}$ cm$^{-3}$ (hydrogen annealing step (S70)) is performed. In this way, a semiconductor device 1 according to the present invention having increased carrier mobility (channel mobility) can be readily manufactured.

The above method for manufacturing a silicon carbide semiconductor device may further include a step of introducing nitrogen atoms into the region within 10 nm of the interface between the semiconductor layer (p-type layer 4, p region 23) and the insulating film (oxide film 8, 26) (nitrogen annealing step (S50)). In this case, the silicon carbide semiconductor device containing the nitrogen atoms in addition to the hydrogen atoms can be readily manufactured in the above region.

In the above method for manufacturing a silicon carbide semiconductor device, the step of introducing nitrogen atoms (nitrogen annealing step (S50)) includes a step of using a gas containing the nitrogen atoms as an atmosphere gas for heat treatment of the substrate where the insulating film (oxide film 8, 26) is formed. In this case, the concentration of the nitrogen atoms in the vicinity of the interface between the semiconductor layer (p-type layer 4 including the channel region, p region 23) and oxide film 8, 26 can be readily adjusted.

In the above method for manufacturing a silicon carbide semiconductor device, the step of introducing nitrogen atoms (nitrogen annealing step (S50)) may include a step of using the gas containing the nitrogen atoms as the atmosphere gas for heat treatment, and then, using an inert gas as the atmosphere gas for heat treatment of the above-described substrate. In this case, the carrier mobility in semiconductor device 1 can be further increased.

In the above method for manufacturing a silicon carbide semiconductor device, the step of adjusting a concentration of hydrogen atoms (hydrogen annealing step (S70)) may include a step of using a gas containing the hydrogen atoms as an atmosphere gas for heat treatment of the substrate where the insulating film (oxide film 8, 26) is formed. In this case, the concentration of the hydrogen atoms in the vicinity of the interface between the semiconductor layer (p-type layer 4 including the channel region, p region 23) and oxide film 8, 26 can be readily adjusted.

In the above method for manufacturing a silicon carbide semiconductor device, the step of adjusting a concentration of hydrogen atoms (hydrogen annealing step (S70)) may include a step of using the gas containing the hydrogen atoms as the atmosphere gas for heat treatment, and then, using an inert gas as the atmosphere gas for heat treatment of the substrate. In this case, the carrier mobility in semiconductor device 1 can be further increased.

In the above method for manufacturing a silicon carbide semiconductor device, the gas containing the hydrogen atoms may be water vapor or water vapor-containing oxygen gas. In this case, since the water vapor that is easily available and easy to handle is used, the above hydrogen annealing step (S70) can be performed with relative ease.

In a method for manufacturing a silicon carbide semiconductor device according to the present invention, a step of preparing a substrate 2 made of silicon carbide and having an off-angle of greater than or equal to 50° and less than or equal to 65° with respect to a surface orientation of {0001} (substrate preparation step (S10)) is performed. A step of forming a semiconductor layer on substrate 2 (epitaxial layer formation step (S20)) is performed. Furthermore, a step of forming an insulating film to contact with a surface of the semiconductor layer (gate insulating film formation step (S40)) is performed. A step of adjusting a total concentration of nitrogen atoms and hydrogen atoms in a region within 10 nm of an interface between the semiconductor layer and the insulating film such that a maximum value of the total concentration is greater than or equal to $1 \times 10^{21}$ cm$^{-3}$ (nitrogen annealing step (S50) and hydrogen annealing step (S70)) is performed. In this way, a semiconductor device 1 according to the present invention having increased carrier mobility (channel mobility) can be readily manufactured.

EXAMPLE 1

The details of an experiment conducted to check the effect of the present invention will be described hereinafter.

(As to Sample)

A semiconductor device having a structure shown in FIG. 1 was fabricated as a sample as follows. An epitaxial layer 3 having a thickness of 10 μm was formed on an n-type silicon carbide substrate 2 having a thickness of 400 μm, and a p-type layer 4 having a thickness of 1 μm was formed on epitaxial layer 3. Then, phosphorus (P) was implanted as n-type conductive impurities for n$^+$ regions 5 and 6, when a value of $1\times10^{20}$ cm$^{-3}$ was used as the concentration of the impurities. In addition, the gate length (channel length $L_g$) that refers to the distance between n$^+$ regions 5 and 6 was set to 100 μm. Moreover, the gate width (channel width) was set to 200 μm.

A sample that was subjected to nitrogen annealing after formation of an oxide film by a dry oxidation process was fabricated as a sample for Example 1 of the present invention. In addition, a sample that was subjected to the nitrogen annealing after formation of an oxide film, and further subjected to an annealing process where the argon gas serving as the inert gas was used as the atmosphere (argon annealing process) was fabricated as a sample for Example 2 of the present invention. Here, as a condition for the dry oxidation process to form an oxide film 8, a condition that the heating temperature was 1200° C. and the heating time was 30 minutes was used. In the nitrogen annealing step for the sample for Example 1 of the present invention, the nitric oxide gas was used as the atmosphere gas, and the heating temperature was set to 1100° C. and the heating time was set to 60 minutes. In the nitrogen annealing step for the sample for Example 2 of the present invention, the nitric oxide gas was used as the atmosphere gas, and the heating temperature was set to 1100° C. and the heating time was set to 120 minutes. In the argon annealing process for the sample for Example 2 of the present invention, the argon gas was used as the atmosphere gas, and a condition that the heating temperature was 1100° C. and the heating time was 60 minutes was used.

In addition, a sample that was not subjected to the nitrogen annealing step after formation of a gate insulating film was fabricated as a sample for a comparative example. The above oxide film in Example 1 had a thickness of 40 nm, the oxide film in Example 2 had a thickness of 46 nm, and the oxide film in the comparative example had a thickness of 33 nm.

After the insulating film as described above was formed, a source electrode 11 and a drain electrode 12 were formed, and further, a gate electrode 10 was formed on oxide film 8 serving as the gate insulating film as shown in FIG. 1, similarly to the manufacturing method in the first embodiment of the present invention. Source electrode 11 and drain electrode 12 were made of nickel (Ni) and had a thickness of 0.1 μm. In addition, gate electrode 10 was made of aluminum (Al) and had a thickness of 1 μm.

(Method of Measurement)

The concentration distribution of nitrogen atoms in the depth direction in the vicinity of an interface between oxide film 8 and p-type layer 4 serving as a semiconductor layer was measured as to each of the samples described above. The SIMS (secondary ion mass spectroscopy) was used as a method of measurement. In addition, the channel mobility was measured in the formed semiconductor devices. The following method was used as a method of measurement. A source-drain voltage was set to $V_{DS}$=0.1V and a gate voltage VG was applied to measure a source-drain current $I_{DS}$ (to measure the gate voltage dependency). Then, assuming that $g_m=(\delta I_{DS})/(\delta V_G)$, a maximum value of the channel mobility with respect to the gate voltage was determined from the following equation:

channel mobility $\mu = g_m \times (L \times d)/(W \times \epsilon \times V_{Ds})$ (where L: gate length, d: thickness of the oxide film, W: gate width, ε: permittivity of the oxide film).

(Result of Measurement)

Figure 18:
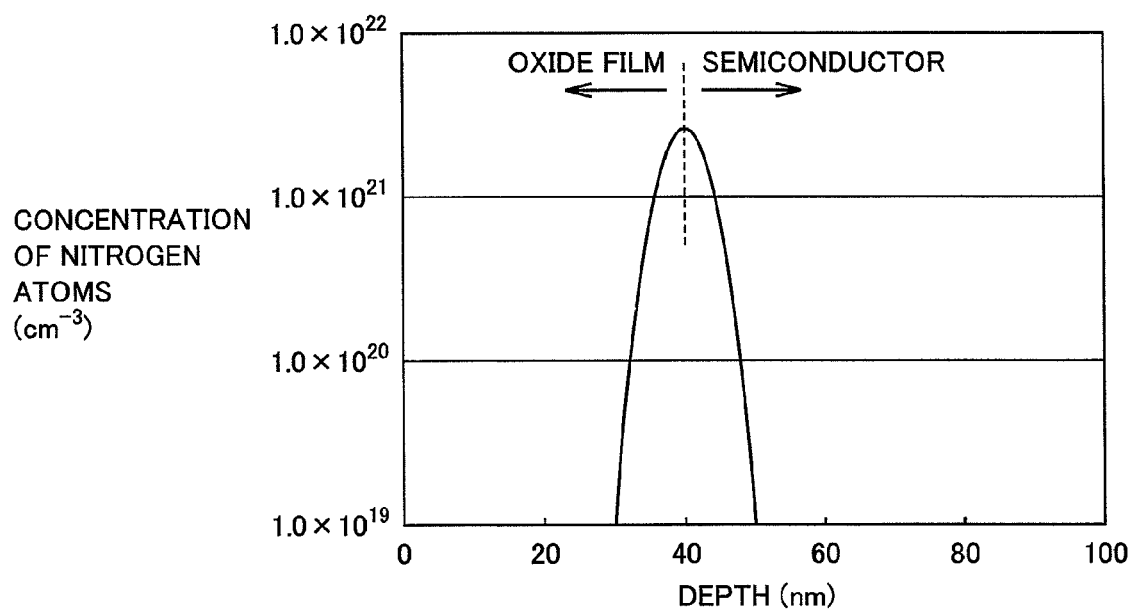
FIG. 18 is a graph showing the concentration of nitrogen atoms in the depth direction of a sample in Example 1 of the present invention.

The concentration distribution of the nitrogen atoms in the depth direction was basically as shown in FIG. 18. In FIG. 18, the horizontal direction indicates the depth from the surface of the oxide film and it is expressed in the unit nm. The vertical axis indicates the concentration of the nitrogen atoms (it is expressed in the unit cm$^{-3}$). As can be seen from FIG. 18, the nitrogen atoms had the highest concentration in the interface portion between oxide film 8 and p-type layer 4 serving as the semiconductor layer. It is seen that the nitrogen atoms were distributed within a range of ±10 nm around the interface between oxide film 8 and p-type layer 4. Although FIG. 18 shows the measurement data about Example 1, the substantially similar concentration distribution of the nitrogen atoms was also obtained as to Example 2. In Example 2, however, the maximum value (peak value) of the concentration of the nitrogen atoms was higher than that in Example 1.

Figure 19:
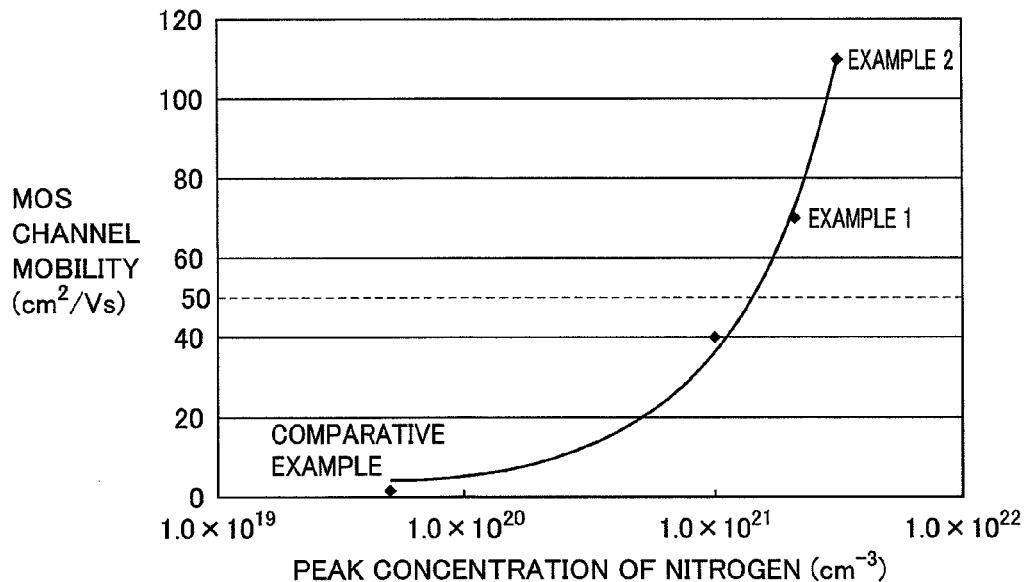
FIG. 19 is a graph showing the relationship between the measured peak value of the concentration of the nitrogen atoms and the channel mobility.

Next, the result of the measurement of the mobility in the channel is shown in FIG. 19. The horizontal axis in FIG. 19 indicates the peak value of the concentration of the nitrogen atoms (peak concentration of the nitrogen atoms) measured in each sample. It is expressed in the unit cm$^{-3}$. The vertical axis in FIG. 19 indicates the channel mobility in the measured semiconductor devices (MOS channel mobility). It is expressed in the unit cm$^2$/Vs.

As shown in FIG. 19, the sample for the comparative example had the lowest peak concentration of the nitrogen atoms, and at the same time, had the lowest value of the channel mobility. On the other hand, the samples for Examples 1 and 2 both had higher peak concentration of the nitrogen atoms, and at the same time, had larger values of the channel mobility than that of the sample for the comparative example. Comparing the sample for Example 1 and the sample for Example 2, the sample for Example 2 having higher peak concentration of the nitrogen atoms had a larger value of the channel mobility than that of the sample for Example 1.

Here, as compared with the conventional MOSFET using silicon, a minimum value required for the channel mobility to achieve lower on-state resistance is considered as 50 cm$^2$/Vs. Therefore, even in consideration of variations in the process, it is considered that a sufficient value of the channel mobility can be achieved if the peak concentration of the nitrogen atoms is set to greater than or equal to $1\times10^{21}$ cm$^{-3}$, based on FIG. 19.

EXAMPLE 2

Next, the relationship between the off-angle of substrate 2 and the channel mobility was checked. The specific description will follow.

(Sample)

A sample was fabricated by using a manufacturing method similar to the method for manufacturing the sample for Example 2 described above. Specifically, different surface orientations of main surfaces of substrates were used to fabricate four types of samples for comparative examples and three types of samples for examples of the present invention. In other words, a silicon carbide substrate whose main surface has a surface orientation where an off-angle is 8° with respect to (0001) (8°-off substrate with respect to (0001)) was prepared as a comparative example 1. A substrate whose main surface has a surface orientation indicated by (01-15) was prepared as a comparative example 2. A substrate whose main surface has a surface orientation indicated by (01-14) was prepared as a comparative example 3. A substrate whose main surface has a surface orientation where an off-angle is 70° with respect to (0001) was prepared as a comparative example 4. In addition, as for the examples of the present invention, a substrate whose main surface has a surface orientation indicated by (01-13) was prepared as Example 1. A substrate whose main surface has a surface orientation indicated by (03-38) was prepared as Example 2. A substrate whose main surface has a surface orientation indicated by (01-12) was prepared as Example 3. Then, these different substrates were used to form semiconductor devices having similar structures as the samples described above.

(Method of Measurement)

The channel mobility was measured as to each of the samples described above. As a method for measuring the channel mobility, a method basically similar to the method for measuring the channel mobility in Example 1 was used.

(Result of Measurement)

Figure 20:
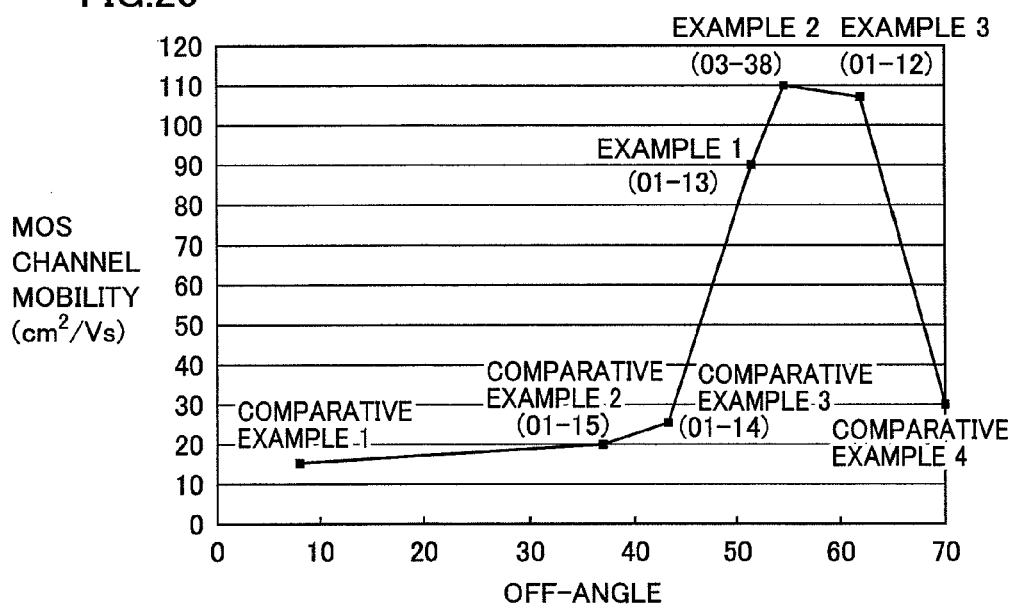
FIG. 20 is a graph showing the relationship between the off-angle of a substrate in Example 2 of the present invention and the channel mobility.

The result of the measurement is shown in FIG. 20. The horizontal axis in FIG. 20 indicates the off-angle (unit: °) of the main surface of the substrate forming each sample with respect to the surface orientation of {0001}. The vertical axis indicates the channel mobility (unit: cm$^2$/Vs) similarly to the vertical axis in FIG. 19. As can be seen from FIG. 20, in the samples for Examples 1 to 3 having the off-angles in the range corresponding to the examples of the present invention (greater than or equal to 50° and less than or equal to 65°), the values of the channel mobility were significantly increased as compared with those of the comparative examples.

EXAMPLE 3

Next, the details of an experiment conducted to check the effect when hydrogen atoms are introduced into a region within 10 nm of an interface between a semiconductor layer and an insulating film will be described.

(As to Sample)

A semiconductor device having a structure shown in FIG. 1 was fabricated as a sample as follows. An epitaxial layer 3 having a thickness of 10 μm was formed on an n-type silicon carbide substrate 2 having a thickness of 400 μm, and a p-type layer 4 having a thickness of 1 μm was formed on epitaxial layer 3. Then, phosphorus (P) was implanted as n-type conductive impurities for n$^+$ regions 5 and 6, when a value of $1 \times 10^{20}$ cm$^{-3}$ was used as the concentration of the impurities. In addition, the gate length (channel length $L_g$) that refers to the distance between n$^+$ regions 5 and 6 was set to 100 μm. Moreover, the gate width (channel width) was set to 200 μm.

A sample that was subjected to hydrogen annealing after formation of an oxide film by a dry oxidation process was fabricated as a sample for Example 1 of the present invention. In addition, a sample that was subjected to the hydrogen annealing after formation of an oxide film, and further subjected to an annealing process where the argon gas serving as the inert gas was used as the atmosphere (argon annealing process) was fabricated as a sample for Example 2 of the present invention. Here, as a condition for the dry oxidation process to form an oxide film 8, a condition that the heating temperature was 1200° C. and the heating time was 30 minutes was used. In the hydrogen annealing step for the sample for Example 1 of the present invention, the hydrogen gas was used as the atmosphere gas, and the heating temperature was set to 1100° C. and the heating time was set to 60 minutes. As a condition for the hydrogen annealing for the sample for Example 2 of the present invention, the hydrogen gas was used as the atmosphere gas, and a condition that the heating temperature was 1100° C. and the heating time was 120 minutes was used. In the argon annealing process for the sample for Example 2, the argon gas was used as the atmosphere gas, and the heating temperature was set to 1100° C. and the heating time was set to 60 minutes.

In addition, a sample that was not subjected to the hydrogen annealing step after formation of a gate insulating film was fabricated as a sample for a comparative example. It is noted that the above oxide film in Example 1 had a thickness of 40 nm, the oxide film in Example 2 had a thickness of 45 nm, and the oxide film in the comparative example had a thickness of 33 nm.

After the insulating film as described above was formed, a source electrode 11 and a drain electrode 12 were formed, and further, a gate electrode 10 was formed on oxide film 8 serving as the gate insulating film as shown in FIG. 1, similarly to the manufacturing method in the first embodiment of the present invention. Source electrode 11 and drain electrode 12 were made of nickel (Ni) and had a thickness of 0.1 μm. In addition, gate electrode 10 was made of aluminum (Al) and had a thickness of 1 μm.

(Method of Measurement)

The concentration distribution of the hydrogen atoms in the depth direction in the vicinity of the interface between oxide film 8 and p-type layer 4 serving as the semiconductor layer was measured as to each of the samples described above by using a method similar to the method of measurement in the test of Example 1 that has been already discussed. In other words, the SIMS (secondary ion mass spectroscopy) was used as a method of measurement. In addition, the channel mobility was measured in the formed semiconductor devices. A method similar to the method of measurement in the test of Example 1 was used as a method of measurement.

(Result of Measurement)

The concentration distribution of the hydrogen atoms in the depth direction was basically similar to the concentration distribution of the nitrogen atoms shown in FIG. 18. In other words, similarly to the concentration distribution of the nitrogen atoms shown in FIG. 18, the hydrogen atoms had the highest concentration in the interface portion between oxide film 8 and p-type layer 4 serving as the semiconductor layer, and the value thereof was greater than or equal to $1 \times 10^{21}$ cm$^{-3}$. The hydrogen atoms were distributed within a range of ±10 nm around the interface between oxide film 8 and p-type layer 4. It is noted that both samples for Examples 1 and 2 described above showed the substantially similar concentration distribution of the hydrogen atoms. In the sample for Example 2, however, the maximum value (peak value) of the concentration of the hydrogen atoms was higher than that of the sample for Example 1.

Next, as for the result of the measurement of the mobility in the channel, the relationship similar to the previously-described relationship between the peak value of the concentration of the nitrogen atoms and the channel mobility as shown in FIG. 19 was obtained.

In other words, as is the case with FIG. 19, the sample for the comparative example had the lowest peak concentration of the hydrogen atoms, and at the same time, had the lowest value of the channel mobility. On the other hand, the samples for Examples 1 and 2 both had higher peak concentration of the hydrogen atoms, and at the same time, had larger values of the channel mobility than that of the sample for the comparative example. Comparing the sample for Example 1 and the sample for Example 2, the sample for Example 2 having higher peak concentration of the hydrogen atoms had a larger value of the channel mobility than that of the sample for Example 1. It is noted that, when an approximate line approximating the data that indicates the relationship between the peak concentration of the hydrogen atoms and the channel mobility was plotted in the graph, a curve substantially similar to the approximate line (curve) in the graph shown in FIG. 19 was obtained.

Here, as compared with the conventional MOSFET using silicon, a minimum value required for the channel mobility to achieve lower on-state resistance is considered as 50 cm$^2$/Vs. Therefore, even in consideration of variations in the process, it is considered that a sufficient value of the channel mobility can be achieved if the peak concentration of the hydrogen atoms is set to greater than or equal to $1\times10^{21}$ cm$^{-3}$, as is the case with the peak concentration of the nitrogen atoms.

EXAMPLE 4

Next, the details of an experiment in which water vapor was used as the atmosphere gas for heat treatment to introduce hydrogen atoms into a region within 10 nm of an interface between a semiconductor layer and an insulating film.

(As to Sample)

A semiconductor device having a structure shown in FIG. 1 was fabricated as a sample. A method for producing the sample is basically similar to the above method for producing the sample in Example 3. In other words, an epitaxial layer 3 having a thickness of 10 μm was formed on an n-type silicon carbide substrate 2 having a thickness of 400 μm, and a p-type layer 4 having a thickness of 1 μm was formed on epitaxial layer 3. Then, phosphorus (P) was implanted as n-type conductive impurities for n$^+$ regions 5 and 6, when a value of $1\times10^{20}$ cm$^{-3}$ was used as the concentration of the impurities. In addition, the gate length (channel length $L_g$) that refers to the distance between n$^+$ regions 5 and 6 was set to 100 μm. Moreover, the gate width (channel width) was set to 200 μm.

A sample that was subjected to water vapor-containing oxygen gas annealing after formation of an oxide film by a dry oxidation process was fabricated as a sample for Example 1 of the present invention. In addition, a sample that was subjected to the water vapor-containing oxygen gas annealing after formation of an oxide film, and further subjected to an annealing process where the argon gas serving as the inert gas was used as the atmosphere (argon annealing process) was fabricated as a sample for Example 2 of the present invention. Here, as a condition for the dry oxidation process to form an oxide film 8, a condition that the heating temperature was 1200° C. and the heating time was 30 minutes was used. In the water vapor-containing oxygen gas annealing step for the sample for Example 1 of the present invention, the oxygen gas containing water vapor was used as the atmosphere gas, and the heating temperature was set to 1100° C. and the heating time was set to 60 minutes. As a condition for the water vapor-containing oxygen gas annealing for the sample for Example 2 of the present invention, the oxygen gas containing water vapor was used as the atmosphere gas, and a condition that the heating temperature was 1100° C. and the heating time was 120 minutes was used. In the argon annealing process for the sample for Example 2, the argon gas was used as the atmosphere gas, and the heating temperature was set to 1100° C. and the heating time was set to 60 minutes.

In addition, a sample that was not subjected to the water vapor-containing oxygen gas annealing step after formation of a gate insulating film was fabricated as a sample for a comparative example. It is noted that the above oxide film in Example 1 had a thickness of 40 nm, the oxide film in Example 2 had a thickness of 44 nm, and the oxide film in the comparative example had a thickness of 33 nm.

After the insulating film as described above was formed, a source electrode 11 and a drain electrode 12 were formed, and further, a gate electrode 10 was formed on oxide film 8 serving as the gate insulating film as shown in FIG. 1, similarly to the manufacturing method in the first embodiment of the present invention. Source electrode 11 and drain electrode 12 were made of nickel (Ni) and had a thickness of 0.1 μm. In addition, gate electrode 10 was made of aluminum (Al) and had a thickness of 1 μm.

(Method of Measurement)

The concentration distribution of hydrogen atoms in the depth direction in the vicinity of the interface between oxide film 8 and p-type layer 4 serving as the semiconductor layer was measured as to each of the samples described above by using a method similar to the method of measurement in the test of Example 1 that has been already discussed. In other words, the SIMS (secondary ion mass spectroscopy) was used as a method of measurement. In addition, the channel mobility was measured in the formed semiconductor devices. A method similar to the method of measurement in the test of Example 1 was used as a method of measurement.

(Result of Measurement)

The concentration distribution of the hydrogen atoms in the depth direction was basically similar to the concentration distribution of the nitrogen atoms shown in FIG. 18, as is the case with the test of Example 3. In other words, similarly to the concentration distribution of the nitrogen atoms shown in FIG. 18, the hydrogen atoms had the highest concentration in the interface portion between oxide film 8 and p-type layer 4 serving as the semiconductor layer, and the value thereof was greater than or equal to $1\times10^{21}$ cm$^{-3}$. The hydrogen atoms were distributed within a range of ±10 nm around the interface between oxide film 8 and p-type layer 4. It is noted that both samples for Examples 1 and 2 described above showed the substantially similar concentration distribution of the hydrogen atoms. In the sample for Example 2, however, the maximum value (peak value) of the concentration of the hydrogen atoms was higher than that of the sample for Example 1.

Next, as for the result of the measurement of the mobility in the channel, the relationship similar to the previously-described relationship between the peak value of the concentration of the nitrogen atoms and the channel mobility as shown in FIG. 19 was obtained.

In other words, as is the case with FIG. 19, the sample for the comparative example had the lowest peak concentration of the hydrogen atoms, and at the same time, had the lowest value of the channel mobility. On the other hand, the samples for Examples 1 and 2 both had higher peak concentration of the hydrogen atoms, and at the same time, had larger values of the channel mobility than that of the sample for the comparative example. Comparing the sample for Example 1 and the sample for Example 2, the sample for Example 2 having higher peak concentration of the hydrogen atoms had a larger value of the channel mobility than that of the sample for Example 1. It is noted that, when an approximate line approximating the data that indicates the relationship between the peak concentration of the hydrogen atoms and the channel mobility was plotted in the graph, a curve substantially similar to the approximate line (curve) in the graph shown in FIG. 19 was obtained.

Here, as compared with the conventional MOSFET using silicon, a minimum value required for the channel mobility to achieve lower on-state resistance is considered as 50 cm$^2$/Vs. Therefore, even in consideration of variations in the process, it is considered that a sufficient value of the channel mobility can be achieved if the peak concentration of the hydrogen atoms is set to greater than or equal to $1\times10^{21}$ cm$^{-3}$, as is the case with the peak concentration of the nitrogen atoms.

EXAMPLE 5

Next, the details of an experiment in which the gas containing nitrogen atoms and hydrogen atoms is used as the atmosphere gas for heat treatment to introduce the nitrogen atoms and the hydrogen atoms into a region within 10 nm of an interface between a semiconductor layer and an insulating film.

(As to Sample)

A semiconductor device having a structure shown in FIG. 1 was fabricated as a sample. A method for producing the sample is basically similar to the above method for producing the sample in Example 3. In other words, an epitaxial layer 3 having a thickness of 10 μm was formed on an n-type silicon carbide substrate 2 having a thickness of 400 μm, and a p-type layer 4 having a thickness of 1 μm was formed on epitaxial layer 3. Then, phosphorus (P) was implanted as n-type conductive impurities for n+ regions 5 and 6, when a value of $1 \times 10^{20}$ cm$^{-3}$ was used as the concentration of the impurities. In addition, the gate length (channel length $L_g$) that refers to the distance between n+ regions 5 and 6 was set to 100 μm. Moreover, the gate width (channel width) was set to 200 μm.

A sample that was subjected to nitrogen annealing after formation of an oxide film by a dry oxidation process was fabricated as a sample for a reference example of the present invention. In addition, a sample that was subjected to the nitrogen annealing after formation of an oxide film, and further subjected to hydrogen annealing was fabricated as a sample for Example 1 of the present invention. Moreover, a sample that was subjected to the nitrogen annealing under the condition different from that of the above sample for the reference example after formation of an oxide film was fabricated as a sample for Example 2 of the present invention. Furthermore, a sample that was subjected to the nitrogen annealing under the condition different from that of above Example 1 after formation of an oxide film, and further subjected to the hydrogen annealing was fabricated as a sample for Example 3 of the present invention. Here, as a condition for the dry oxidation process to form an oxide film 8, a condition that the heating temperature was 1200° C. and the heating time was 30 minutes was used. In the nitrogen annealing step for the sample for the reference example of the present invention, the nitric oxide (NO) gas was used as the atmosphere gas, and the heating temperature was set to 1100° C. and the heating time was set to 20 minutes. As a condition for the nitrogen annealing step for the sample for Example 1 of the present invention, the nitric oxide gas was used as the atmosphere gas, and a condition that the heating temperature was 1100° C. and the heating time was 20 minutes was used. In the hydrogen annealing process for the sample for Example 1, the hydrogen gas was used as the atmosphere gas, and the heating temperature was set to 1100° C. and the heating time was set to 30 minutes. In the nitrogen annealing step for the sample for Example 2, the nitric oxide (NO) gas was used as the atmosphere gas, and the heating temperature was set to 1100° C. and the heating time was set to 60 minutes. As a condition for the nitrogen annealing step for the sample for Example 3 of the present invention, the nitric oxide gas was used as the atmosphere gas, and a condition that the heating temperature was 1100° C. and the heating time was 60 minutes was used. In the hydrogen annealing process for the sample for Example 3, the hydrogen gas was used as the atmosphere gas, and the heating temperature was set to 1100° C. and the heating time was set to 30 minutes.

In addition, a sample that was not subjected to the nitrogen annealing step and the hydrogen annealing step after formation of a gate insulating film was fabricated as a sample for a comparative example. It is noted that the above oxide film in the reference example had a thickness of 41 nm, the oxide film in Example 1 had a thickness of 45 nm, the oxide film in Example 2 had a thickness of 41 nm, the oxide film in Example 3 had a thickness of 45 nm, and the oxide film in the comparative example had a thickness of 33 nm.

After the insulating film as described above was formed, a source electrode 11 and a drain electrode 12 were formed, and further, a gate electrode 10 was formed on oxide film 8 serving as the gate insulating film in each of the samples as shown in FIG. 1, similarly to the manufacturing method in the first embodiment of the present invention. Source electrode 11 and drain electrode 12 were made of nickel (Ni) and had a thickness of 0.1 μm. In addition, gate electrode 10 was made of aluminum (Al) and had a thickness of 1 μm.

(Method of Measurement)

The total concentration distribution of the nitrogen atoms and the hydrogen atoms in the depth direction in the vicinity of the interface between oxide film 8 and p-type layer 4 serving as the semiconductor layer was measured as to each of the samples described above by using a method similar to the method of measurement in the test of Example 1 that has been already discussed. In other words, the SIMS (secondary ion mass spectroscopy) was used as a method of measurement. In addition, the channel mobility was measured in the formed semiconductor devices. A method similar to the method of measurement in the test of Example 1 was used as a method of measurement.

(Result of Measurement)

The total concentration distribution of the nitrogen atoms and the hydrogen atoms in the depth direction was basically similar to the concentration distribution of the nitrogen atoms shown in FIG. 18. In other words, similarly to the concentration distribution of the nitrogen atoms shown in FIG. 18, the nitrogen atoms and the hydrogen atoms had the highest total concentration in the interface portion between oxide film 8 and p-type layer 4 serving as the semiconductor layer. The nitrogen atoms and the hydrogen atoms were distributed within a range of ±10 nm around the interface between oxide film 8 and p-type layer 4.

It is noted that the peak value (maximum value) of the concentration of the nitrogen atoms in the above sample for the reference example was $7 \times 10^{20}$ cm$^{-3}$. In addition, the peak value of the concentration of the nitrogen atoms in the sample for Example 1 was $7 \times 10^{20}$ cm$^{-3}$, and the peak value (maximum value) of the concentration of the hydrogen atoms was $7 \times 10^{20}$ cm$^{-3}$. Moreover, the peak position of the concentration of the nitrogen atoms and the peak position of the concentration of the hydrogen atoms overlapped each other. In other words, the peak value of the total concentration of the nitrogen atoms and the hydrogen atoms in the sample for Example 1 was $1.4 \times 10^{21}$ cm$^{-3}$.

In addition, the peak value (maximum value) of the concentration of the nitrogen atoms in the above sample for Example 2 was $2 \times 10^{21}$ cm$^{-3}$. Moreover, the peak value of the concentration of the nitrogen atoms in the sample for Example 3 was $2 \times 10^{21}$ cm$^{-3}$, and the peak value (maximum value) of the concentration of the hydrogen atoms was $1 \times 10^{21}$ cm$^{-3}$. Furthermore, the peak position of the concentration of the nitrogen atoms and the peak position of the concentration of the hydrogen atoms overlapped each other. In other words, the peak value of the total concentration of the nitrogen atoms and the hydrogen atoms in the sample for Example 3 was $3 \times 10^{21}$ cm$^{-3}$.

Figure 21:
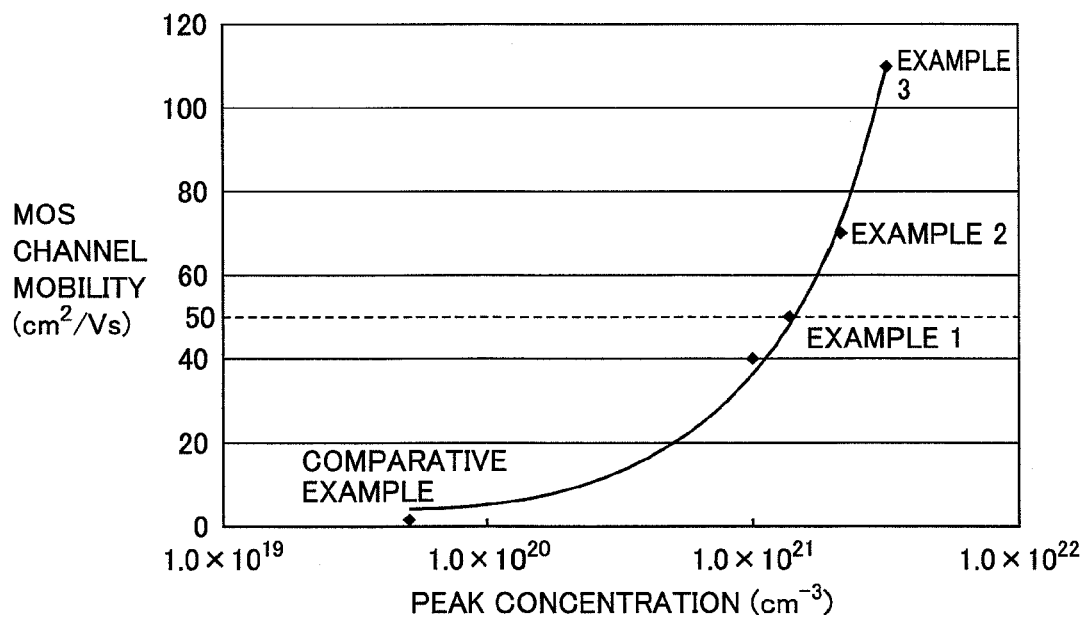
FIG. 21 is a graph showing the relationship between the measured peak value of the total concentration of nitrogen atoms and hydrogen atoms and the channel mobility.

Next, as for the result of the measurement of the mobility in the channel, the relationship similar to the previously-described relationship between the peak value of the concentration of the nitrogen atoms and the channel mobility as shown in FIG. 19 was obtained. The result of the measurement of the mobility in the channel is shown in FIG. 21. The horizontal axis in FIG. 21 indicates the peak value of the total concentration (peak concentration) of the nitrogen atoms and the hydrogen atoms that was measured as to each sample. It is expressed in the unit cm$^{-3}$. The vertical axis in FIG. 21 indicates the channel mobility in the measured semiconductor devices (MOS channel mobility). It is expressed in the unit cm$^2$/Vs.

As shown in FIG. 21, the sample for the comparative example had the lowest peak concentration of the nitrogen atoms, and at the same time, had the lowest value of the channel mobility. On the other hand, all of the samples for Examples 1 to 3 had larger peak values of the total concentration of the nitrogen atoms and the hydrogen atoms, and at the same time, had larger values of the channel mobility than that of the sample for the comparative example. Comparing the samples for Examples 1 to 3, the sample having a larger peak value of the total concentration (peak concentration) of the nitrogen atoms and the hydrogen atoms had a larger value of the channel mobility.

Here, as compared with the conventional MOSFET using silicon, a minimum value required for the channel mobility to achieve lower on-state resistance is considered as 50 cm$^2$/Vs as already discussed. Therefore, even in consideration of variations in the process, it is considered that a sufficient value of the channel mobility can be achieved if the peak value of the total concentration (peak concentration) of the nitrogen atoms and the hydrogen atoms is set to greater than or equal to 1×10$^{21}$ cm$^{-3}$, as is the case with the peak concentration of the nitrogen atoms.

EXAMPLE 6

In order to check the effect of the present invention, a prototype of a semiconductor device was fabricated and the interface state of an interface between a semiconductor layer and an insulating film in the semiconductor device was evaluated.

(As to Sample)

Figure 22:
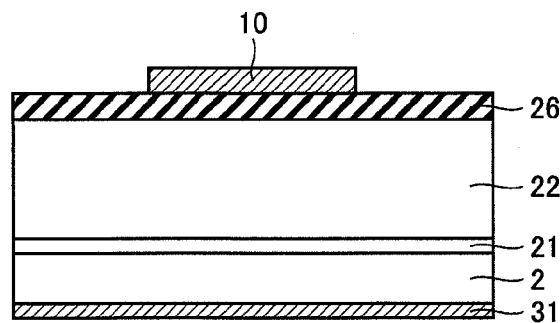
FIG. 22 is a schematic cross-sectional view of a semiconductor device prepared for measurement in Example 6.

A semiconductor device shown in FIG. 22 is an MOS capacitor including a substrate 2 that is an n-type silicon carbide substrate, a buffer layer 21 formed on substrate 2, a voltage maintained layer 22 formed on buffer layer 21, an oxide film 26 formed on voltage maintained layer 22, a gate electrode 10 formed on the oxide film, and a rear surface electrode 31 formed on a rear surface (rear surface opposite to a surface where buffer layer 21 is formed) of substrate 2.

The above semiconductor device was manufactured by performing the following steps. Buffer layer 21 made of an n-type silicon carbide epitaxial layer was formed on the surface of substrate 2 made of n-type silicon carbide and having a thickness of 400 μm. Substrate 2 had a specific resistance of 0.02 Ω·cm. Buffer layer 21 had a thickness of 0.5 μm and the concentration of n-type impurities was set to 5×10$^{17}$ cm$^{-3}$. Then, an n-type silicon carbide epitaxial layer 3 having a thickness of 10 μm was formed on buffer layer 21 to act as voltage maintained layer 22. The concentration of n-type impurities in voltage maintained layer 22 was set to 5×10$^{15}$ cm$^{-3}$.

A sample that was subjected to nitrogen annealing after oxide film 26 was formed on a surface of voltage maintained layer 22 by a dry oxidation process was fabricated as a sample for an example of the present invention. Here, as a condition for the dry oxidation process to form oxide film 26, a condition that the heating temperature was 1200° C. and the heating time was 30 minutes was used. In the nitrogen annealing step for the sample for the example of the present invention, the nitric oxide (NO) gas was used as the atmosphere gas, and the heating temperature was set to 1100° C. and the heating time was set to 60 minutes.

In addition, a sample that was not subjected to the nitrogen annealing step after formation of oxide film 26 was fabricated as a sample for a comparative example. It is noted that above oxide film 26 in the example had a thickness of 40 nm, and oxide film 26 in the comparative example had a thickness of 33 nm.

After oxide film 26 serving as the insulating film was formed as described above, rear surface electrode 31 serving as an ohmic electrode was formed on the rear surface of substrate 2, and gate electrode 10 was formed on oxide film 26 serving as a gate insulating film as shown in FIG. 22. Rear surface electrode 31 was made of nickel (Ni) and had a thickness of 0.1 μm. In addition, rear surface electrode 31 was subjected to an alloying process (heat treatment) in the argon (Ar) atmosphere under the condition that the heating temperature was 950° C. and the heating time was 2 minutes. Gate electrode 10 was made of aluminum (Al) and had a thickness of 1 μm. In addition, gate electrode 10 had a circular two-dimensional shape whose diameter was 800 μm. By performing these steps, the samples for the example and the comparative example having the configuration of the semiconductor device shown in FIG. 22 can be obtained.

(Method of Measurement)

The capacitance-voltage characteristic (CV characteristic) was measured as to the above samples for the example and the comparative example having the configuration of the semiconductor device shown in FIG. 22 (MOS capacitor). It is noted that the measurement frequency was set to 1 MHz in the high-frequency CV measurement. In addition, the low-frequency CV measurement was carried out by using a Quasistatic CV measurement method. It is noted that a capacitance Cs caused by a depletion layer formed on the semiconductor side of the MOS interface was determined by solving the Poisson's equation. At this time, the inverted state was not taken into consideration and the deep depletion state was assumed.

In addition, the interface state density was calculated as to the above samples for the example and the comparative example by using a High-Low method. A method for calculating the interface state density by using the High-Low method will be outlined hereinafter.

In the above high-frequency CV measurement, a capacitance $C_{it}$ caused by the interface state having a relatively large emission time constant does not appear as a capacitive component. On the other hand, in the measurement of the CV obtained at frequencies low enough for capture/emission of electrons from/to the interface state to respond (low-frequency CV measurement), the capacitance is observed as a value obtained by adding the capacitance caused by the interface state to the capacitance in the high-frequency CV measurement. Here, the capacitance obtained by the low-frequency CV measurement includes information of the oxide film capacitance, the depletion layer capacitance and the interface state capacitance. Therefore, a capacitance $C_{LF}$ obtained by the low-frequency CV measurement is expressed by the following mathematical formula (1).

[Num 1]

$$\frac{1}{C_{LF}} = \frac{1}{C_{ox}} + \frac{1}{C_D + C_{it}} \tag{1}$$

In the high-frequency CV measurement, however, the interface state capacitance does not respond (is not detected) as described above, and therefore, a capacitance $C_{HF}$ obtained by the high-frequency CV measurement is expressed by the following mathematical formula (2).

[Num 2]

$$\frac{1}{C_{HF}} = \frac{1}{C_{ox}} + \frac{1}{C_D} \quad (2)$$

Therefore, based on the above mathematical formulas (1) and (2), an interface state density $D_{it}$ can be determined by using the following mathematical formula (3).

[Num 3]

$$D_{it} = \frac{C_{ox}}{q}\left(\frac{C_{LF}/C_{ox}}{1-C_{LF}/C_{ox}} - \frac{C_{HF}/C_{ox}}{1-C_{HF}/C_{ox}}\right) \quad (\because C_{it} = qD_{it}) \quad (3)$$

(Result of Measurement)

The result of the above measurement will be described with reference to FIGS. 23 to 25.

Figure 23:
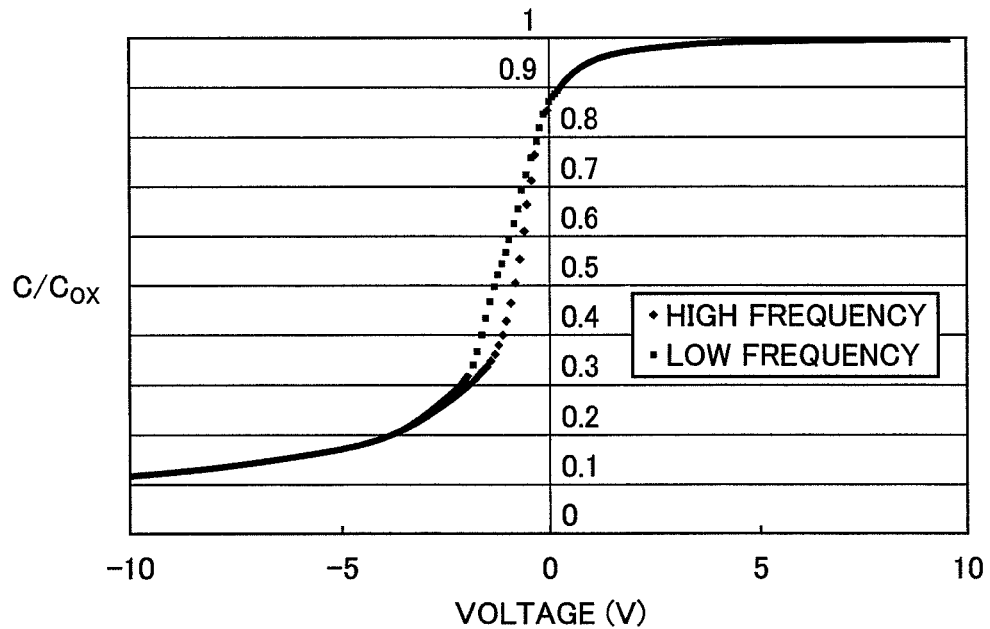
FIG. 23 is a graph showing the CV characteristic of a sample for an example.
Figure 24:
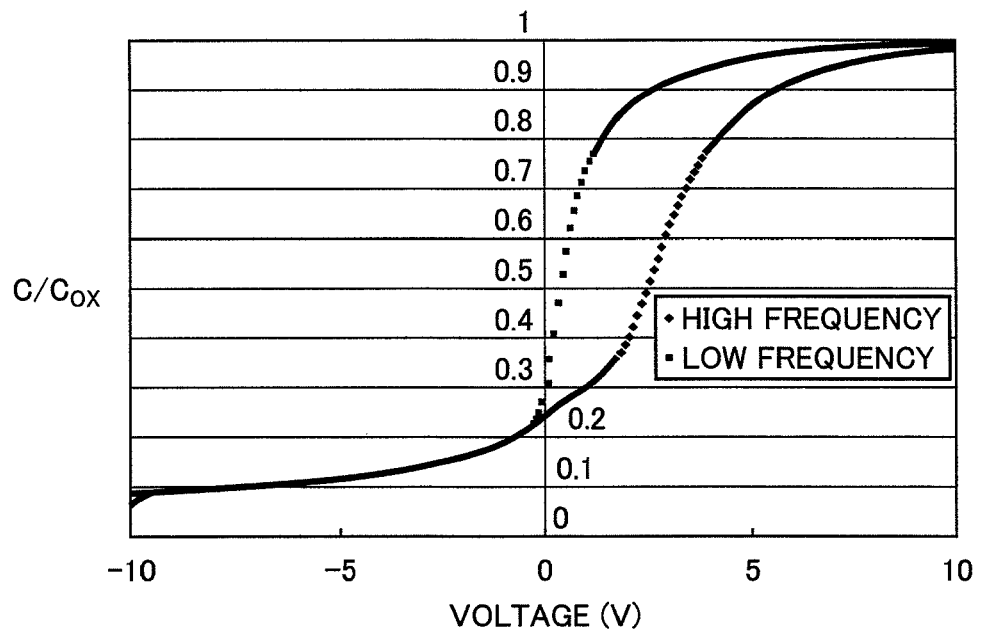
FIG. 24 is a graph showing the CV characteristic of a sample for a comparative example.

In the graphs shown in FIGS. 23 and 24, the horizontal axis indicates the voltage and the vertical axis indicates the capacitance. The vertical axis, however, represents the capacitance obtained by standardizing an overall capacitance C with an oxide film capacitance $C_{ox}$. As can be seen from FIGS. 23 and 24, a large difference between the high-frequency CV characteristic and the low-frequency CV characteristic was not found in the sample for the example of the present invention shown in FIG. 23. On the other hand, a relatively large difference between the high-frequency CV characteristic and the low-frequency CV characteristic was seen in the sample for the comparative example shown in FIG. 24. It is considered that this is because the capacitance caused by the interface state (interface state capacitance) had a greater effect on the sample for the comparative example than on the sample for the example.

Figure 25:
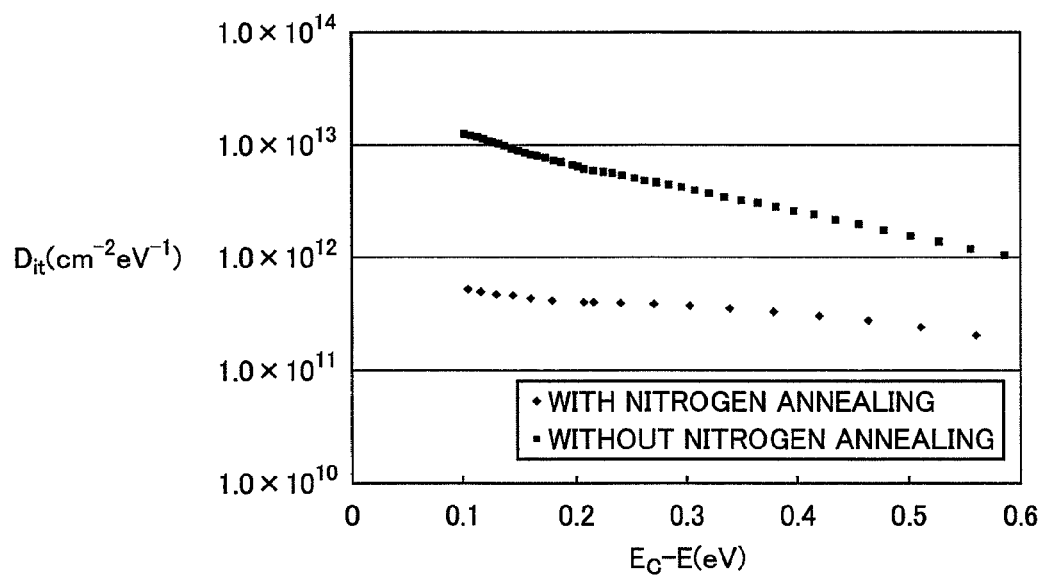
FIG. 25 is a graph showing the relationship between the interface state density calculated from the CV characteristic shown in above FIGS. 23 and 24, and the energy with respect to that of a conduction band.

The result of the calculation of the interface state density as to the samples for the example and the comparative example by using the above High-Low method is shown in FIG. 25. In FIG. 25, the vertical axis indicates the interface state density, and the horizontal axis indicates the value of the energy with respect to that of a conduction band.

As can be seen from FIG. 25, the interface state density of the sample for the example (with the nitrogen annealing) was lower than that of the sample for the comparative example (without the nitrogen annealing) in any energy level. In addition, the interface state density of the sample for the example was also smaller than $1 \times 10^{12}$ cm$^{-2}$ eV$^{-1}$ in an energy level lower than 0.1 eV that of the conduction band.

EXAMPLE 7

In order to check the effect of the present invention, a sample was produced and the relationship between the interface state density and the MOS channel mobility was evaluated.

(As to Sample)

A semiconductor device having a structure shown in FIG. 1 was fabricated as a sample as follows. An epitaxial layer 3 having a thickness of 10 μm was formed on an n-type silicon carbide substrate 2 having a thickness of 400 μm, and a p-type layer 4 having a thickness of 1 μm was formed on epitaxial layer 3. Then, phosphorus (P) was implanted as n-type conductive impurities for n$^+$ regions 5 and 6, when a value of $1 \times 10^{20}$ cm$^{-3}$ was used as the concentration of the impurities. In addition, the gate length (channel length $L_g$) that refers to the distance between n$^+$ regions 5 and 6 was set to 100 μm. Moreover, the gate width (channel width) was set to 200 μm.

A sample that was subjected to nitrogen annealing after formation of an oxide film by a dry oxidation process was fabricated as a sample for Example 1 of the present invention. In addition, a sample that was subjected to the nitrogen annealing after formation of an oxide film, and further subjected to an annealing process where the argon gas serving as the inert gas was used as the atmosphere (argon annealing process) was fabricated as a sample for Example 2 of the present invention. Here, as a condition for the dry oxidation process to form an oxide film 8, a condition that the heating temperature was 1200° C. and the heating time was 30 minutes was used. In the nitrogen annealing step for the sample for Example 1 of the present invention, the NO gas was used as the atmosphere gas, and the heating temperature was set to 1100° C. and the heating time was set to 60 minutes. As a condition for the nitrogen annealing step for the sample for Example 2 of the present invention, the NO gas was used as the atmosphere gas, and a condition that the heating temperature was 1100° C. and the heating time was 120 minutes was used. In the argon annealing process for the sample for Example 2, the argon gas was used as the atmosphere gas, and the heating temperature was set to 1100° C. and the heating time was set to 60 minutes.

In addition, a sample that was not subjected to the hydrogen annealing step after formation of a gate insulating film was fabricated as a sample for a comparative example. It is noted that the above oxide film in Example 1 had a thickness of 40 nm, the oxide film in Example 2 had a thickness of 46 nm, and the oxide film in the comparative example had a thickness of 33 nm.

After the insulating film as described above was formed, a source electrode 11 and a drain electrode 12 were formed, and further, a gate electrode 10 was formed on oxide film 8 serving as the gate insulating film as shown in FIG. 1, similarly to the manufacturing method in the first embodiment of the present invention. Source electrode 11 and drain electrode 12 were made of nickel (Ni) and had a thickness of 0.1 μm. In addition, gate electrode 10 was made of aluminum (Al) and had a thickness of 1 μm.

(Method of Measurement)

The channel mobility was measured in the samples of the formed semiconductor devices. As a method of measurement, a method similar to the method of measurement in the test of Example 1 was used.

In addition, the interface state density was calculated as to each sample by using a method similar to the method in the test of above Example 6 (that is, by using the High-Low method based on the data of the high-frequency CV characteristic and the low-frequency CV characteristic).

(Result of Measurement)

Figure 26:
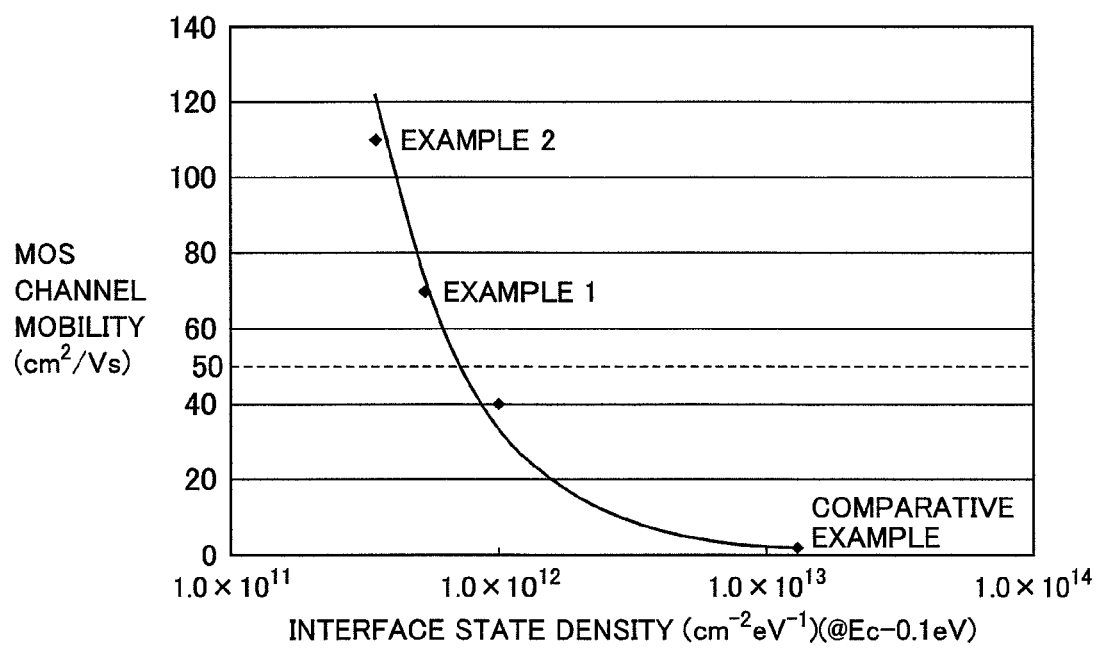
FIG. 26 is a graph showing the relationship between the measured MOS channel mobility and the interface state density.

The result of the measurement is shown in FIG. 26. The horizontal axis in FIG. 26 indicates the value of the interface state density in an energy level lower than 0.1 eV that of a conduction band. It is expressed in the unit cm$^{-2}$ eV$^{-1}$. The vertical axis in FIG. 26 indicates the channel mobility in the measured semiconductor devices (MOS channel mobility). It is expressed in the unit cm$^2$/Vs.

As can be seen from FIG. 26, as the interface state density was lowered, the channel mobility was increased. Here, as compared with the conventional MOSFET using silicon, a minimum value required for the channel mobility to achieve lower on-state resistance is considered as 50 cm²/Vs as already discussed. It can also be seen from FIG. 26 that a range of the interface state density where the channel mobility is 50 cm²/Vs is less than or equal to $7\times10^{11}$ cm$^{-2}$ eV$^{-1}$. Generally, however, a large error may be included in the measured value of the interface state density. Therefore, according to the inventor's experience, it is considered that the sufficient channel mobility can be achieved if the interface state density (in the energy level lower than 0.1 eV that of the conduction band) is set to smaller than $1\times10^{12}$ cm$^{-2}$ eV$^{-1}$.

It should be understood that the embodiments and the examples disclosed herein are illustrative and not limitative in any respect. The scope of the present invention is defined by the terms of the claims, rather than the description above, and is intended to include any modifications within the scope and meaning equivalent to the terms of the claims.

INDUSTRIAL APPLICABILITY

The present invention is advantageously applied to a silicon carbide semiconductor device where an insulating film is formed to contact with a semiconductor layer made of silicon carbide, such as an MOSFET and a DiMOSFET.

The invention claimed is:

1. A silicon carbide semiconductor device, comprising:
 a substrate made of silicon carbide and having an off-angle of greater than or equal to 50° and less than or equal to 65° with respect to a surface orientation of {0001};
 a semiconductor layer formed on said substrate and made of silicon carbide; and
 an insulating film formed to contact with a surface of said semiconductor layer,
 a maximum value of a concentration of nitrogen atoms in a region within 10 nm of an interface between said semiconductor layer and said insulating film being greater than or equal to $1\times10^{21}$ cm$^{-3}$, and
 a channel mobility in a channel region, facing said insulating film in said semiconductor layer, is greater than or equal to 50 cm²/Vs.

2. The silicon carbide semiconductor device according to claim 1, wherein
 hydrogen atoms are contained in said region within 10 nm of the interface between said semiconductor layer and said insulating film.

3. The silicon carbide semiconductor device according to claim 1, wherein
 an interface state density in an energy level lower than 0.1 eV that of a conduction band is smaller than $1\times10^{12}$ cm$^{-2}$ eV$^{-1}$.

4. The silicon carbide semiconductor device according to claim 3, wherein
 a channel mobility of the substrate is greater than or equal to 50 cm²/Vs.

5. The silicon carbide semiconductor device according to claim 1, wherein
 said substrate has an off-orientation in a range of less than or equal to ±5° in a <11-20> direction.

6. The silicon carbide semiconductor device according to claim 1, wherein
 said substrate has an off-orientation in a range of less than or equal to ±5° in a <01-10> direction.

7. The silicon carbide semiconductor device according to claim 6, wherein
 a main surface of said substrate has a surface orientation whose off-angle is greater than or equal to −3° and less than or equal to +5° with respect to a surface orientation of {03-38}.

8. A method for manufacturing a silicon carbide semiconductor device, comprising the steps of:
 preparing a substrate made of silicon carbide and having an off-angle of greater than or equal to 50° and less than or equal to 65° with respect to a surface orientation of {0001};
 forming a semiconductor layer on said substrate;
 forming an insulating film to contact with a surface of said semiconductor layer; and
 adjusting a concentration of nitrogen atoms in a region within 10 nm of an interface between said semiconductor layer and said insulating film such that a maximum value of the concentration of the nitrogen atoms is greater than or equal to $1\times10^{21}$ cm$^{-3}$, and
 a channel mobility in a channel region, facing said insulating film in said semiconductor layer, is greater than or equal to 50 cm²/Vs.

9. The method for manufacturing a silicon carbide semiconductor device according to claim 8, further comprising the step of:
 introducing hydrogen atoms into said region within 10 nm of the interface between said semiconductor layer and said insulating film.

10. The method for manufacturing a silicon carbide semiconductor device according to claim 9, wherein
 said step of introducing hydrogen atoms includes a step of using a gas containing the hydrogen atoms as an atmosphere gas for heat treatment of said substrate where said insulating film is formed.

11. The method for manufacturing a silicon carbide semiconductor device according to claim 10, wherein
 said gas containing the hydrogen atoms is water vapor or water vapor-containing oxygen.

12. The method for manufacturing a silicon carbide semiconductor device according to claim 8, wherein
 said step of adjusting a concentration of nitrogen atoms includes a step of using a gas containing the nitrogen atoms as an atmosphere gas for heat treatment of said substrate where said insulating film is formed.

13. The method for manufacturing a silicon carbide semiconductor device according to claim 12, wherein
 said step of adjusting a concentration of nitrogen atoms includes a step of using said gas containing the nitrogen atoms as the atmosphere gas for heat treatment, and then, using an inert gas as the atmosphere gas for heat treatment of said substrate.

14. The method for manufacturing a silicon carbide semiconductor device according to claim 8, wherein
 a channel mobility of the substrate is greater than or equal to 50 cm²/Vs.

* * * * *